(12) United States Patent
Bettinelli

(10) Patent No.: US 12,317,605 B2
(45) Date of Patent: May 27, 2025

(54) PHOTOVOLTAIC CELL AND STRING AND ASSOCIATED METHODS

(71) Applicant: COMMISSARIAT A L'ENERGIE ATOMIQUE ET AUX ENERGIES ALTERNATIVES, Paris (FR)

(72) Inventor: Armand Bettinelli, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 37 days.

(21) Appl. No.: 17/927,619

(22) PCT Filed: May 25, 2021

(86) PCT No.: PCT/EP2021/063918
§ 371 (c)(1),
(2) Date: Nov. 23, 2022

(87) PCT Pub. No.: WO2021/239737
PCT Pub. Date: Dec. 2, 2021

(65) Prior Publication Data
US 2023/0170431 A1 Jun. 1, 2023

(30) Foreign Application Priority Data
May 27, 2020 (FR) ........................... 2005603

(51) Int. Cl.
*H10F 19/90* (2025.01)
*H10F 71/00* (2025.01)
(Continued)

(52) U.S. Cl.
CPC ......... *H10F 19/904* (2025.01); *H10F 19/906* (2025.01); *H10F 71/00* (2025.01); *H10F 77/215* (2025.01); *H10F 77/935* (2025.01)

(58) Field of Classification Search
CPC .............. H02S 20/25; H01L 31/02008; H01L 31/022433; H01L 31/0508; H01L 31/0512;
(Continued)

(56) References Cited

U.S. PATENT DOCUMENTS

2015/0349145 A1\* 12/2015 Morad .................... H02S 40/34
438/67
2016/0284893 A1 9/2016 Teramura et al.
(Continued)

FOREIGN PATENT DOCUMENTS

EP 3 416 196 A1 12/2018
JP 2005-252108 A 9/2005

OTHER PUBLICATIONS

International Search Report as issued in International Patent Application No. PCT/EP2021/063918, dated Sep. 22, 2021.
(Continued)

*Primary Examiner* — Mayla Gonzalez Ramos
(74) *Attorney, Agent, or Firm* — Pillsbury Winthrop Shaw Pittman LLP

(57) ABSTRACT

A photovoltaic cell includes an edge; an interconnection conductive track extending parallel to the edge to within 1.3 mm; and a plurality of electrodes, called "collection fingers", extending parallel to each other and electrically connected to the interconnection track; the interconnection conductive track including a plurality of spaced-apart closed-contour conductive patterns, each closed-contour conductive pattern including a closed contour surrounding a portion of the first face.

20 Claims, 15 Drawing Sheets

(51) Int. Cl.
*H10F 77/00* (2025.01)
*H10F 77/20* (2025.01)

(58) Field of Classification Search
CPC ......... H01L 31/18; H10F 77/00; H10F 77/20; H10F 77/215; H10F 77/935; H10F 71/00; H10F 19/904; H10F 19/906
See application file for complete search history.

(56) References Cited

U.S. PATENT DOCUMENTS

2017/0301801 A1  10/2017  Nguyen et al.
2018/0366596 A1* 12/2018  Chang .................... H01L 31/18

OTHER PUBLICATIONS

Beaucarne, G., "Materials challenge for shingled cells interconnection," Energy Procedia 98, pp. 115-124, (Year: 2016).

* cited by examiner

[Fig. 1]
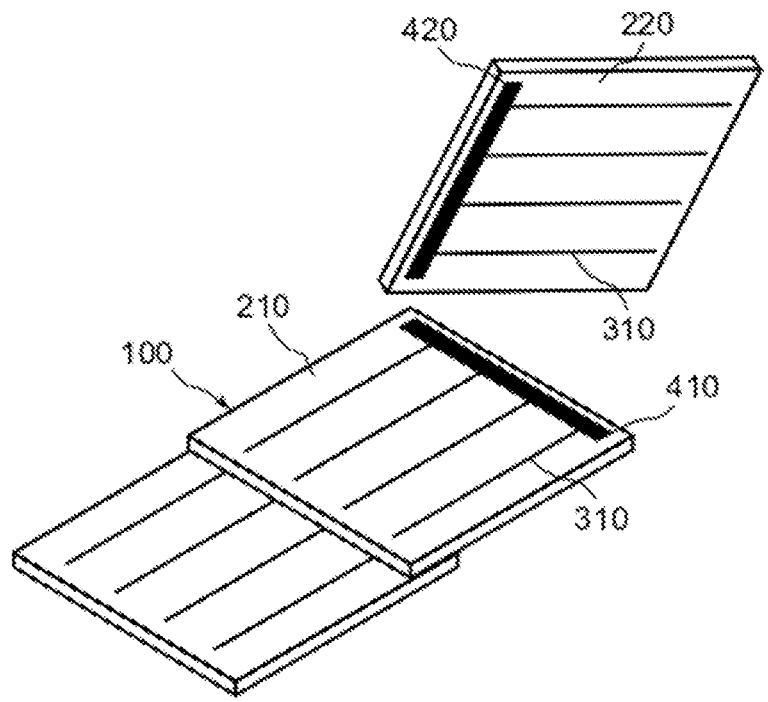
[Fig. 2]
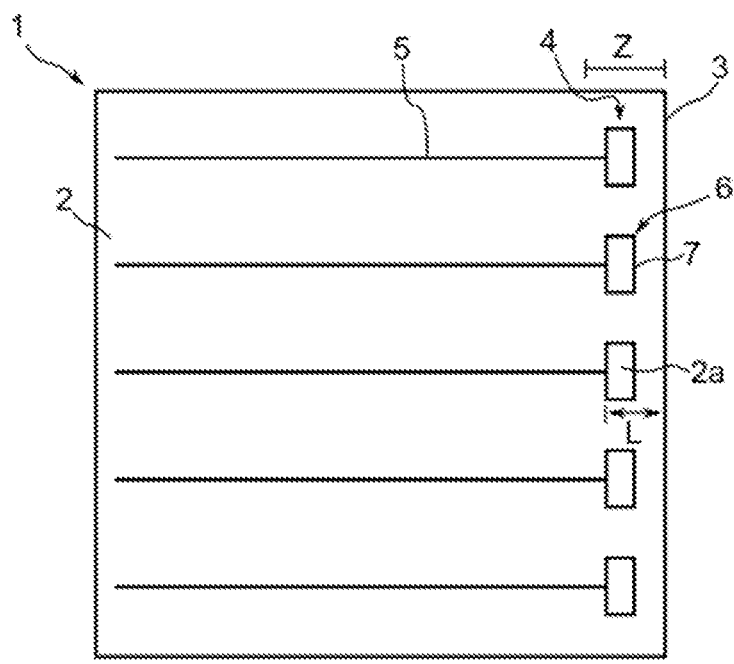

[Fig. 3]
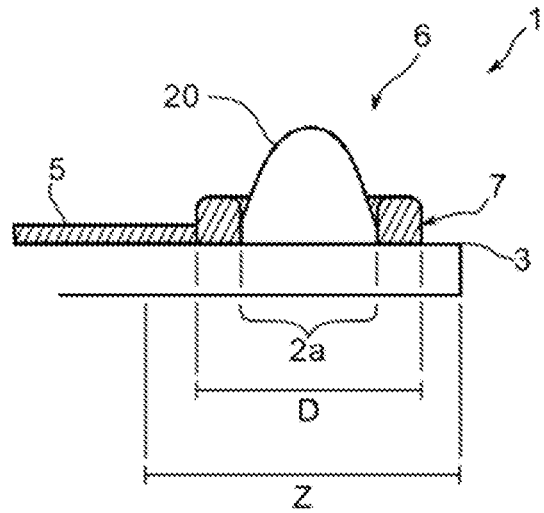
[Fig. 4]
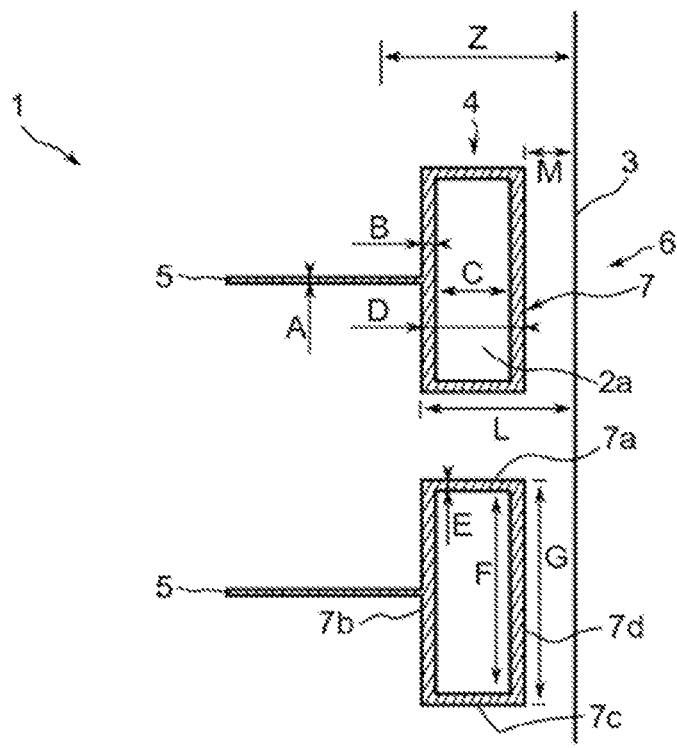

[Fig. 5]
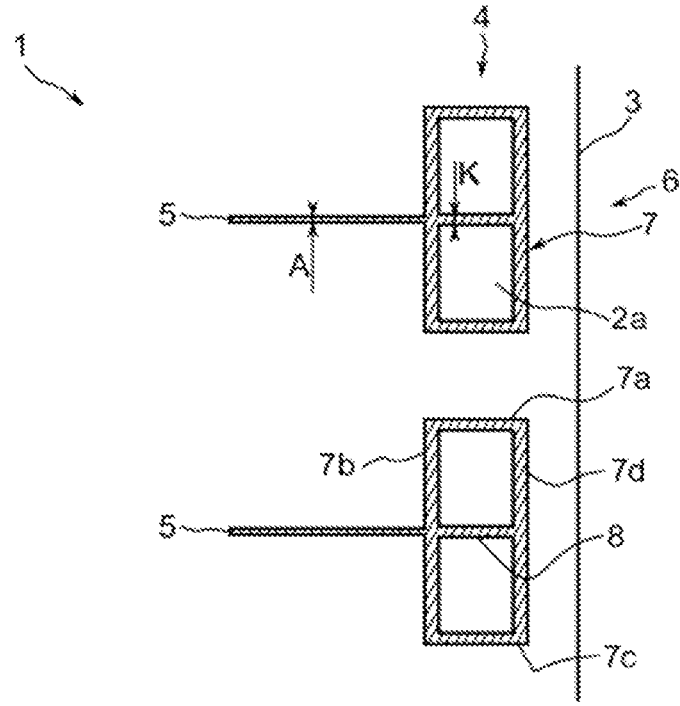
[Fig. 6]
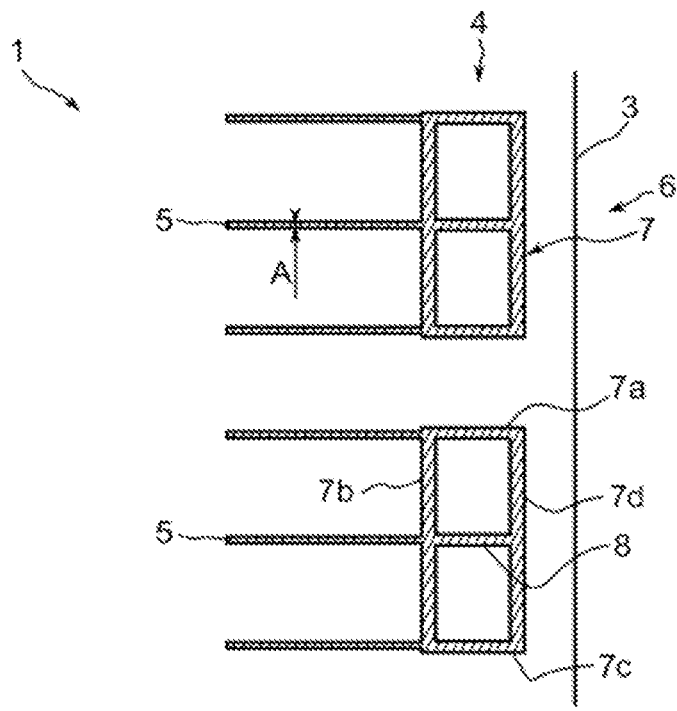

[Fig. 7]
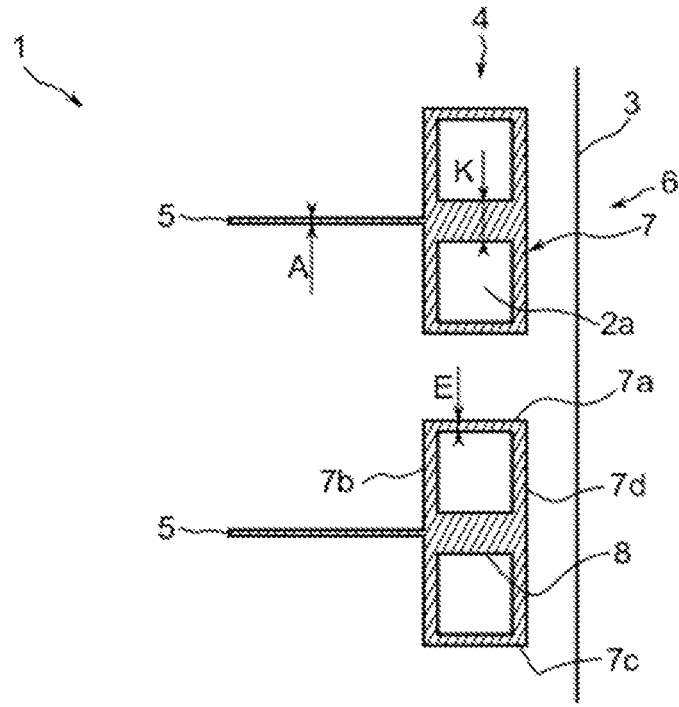
[Fig. 8]
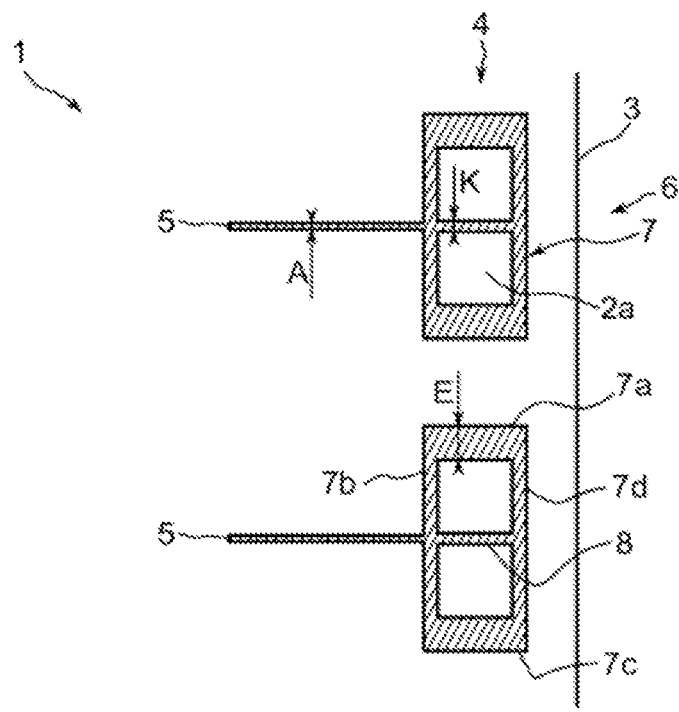

[Fig. 9]
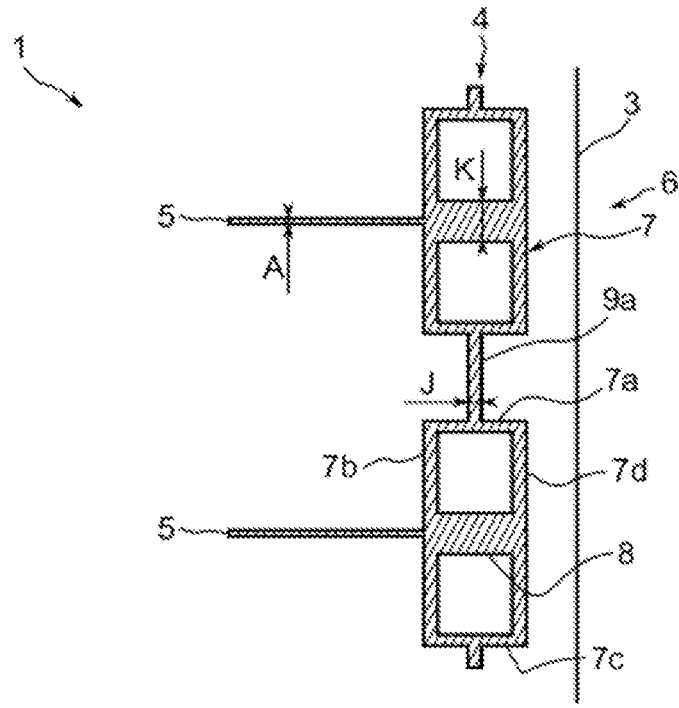
[Fig. 10]
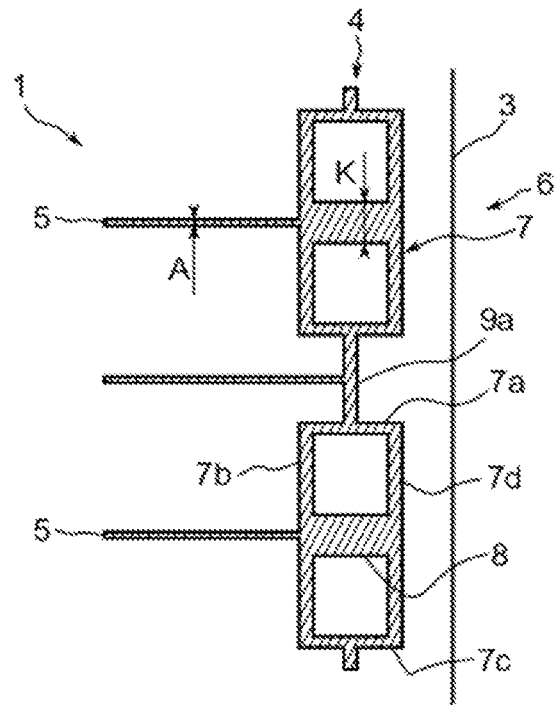

[Fig. 11]
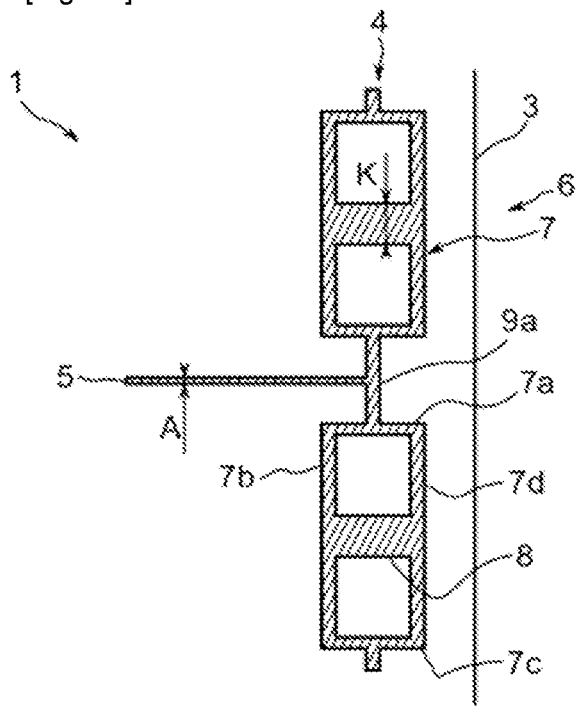
[Fig. 12]
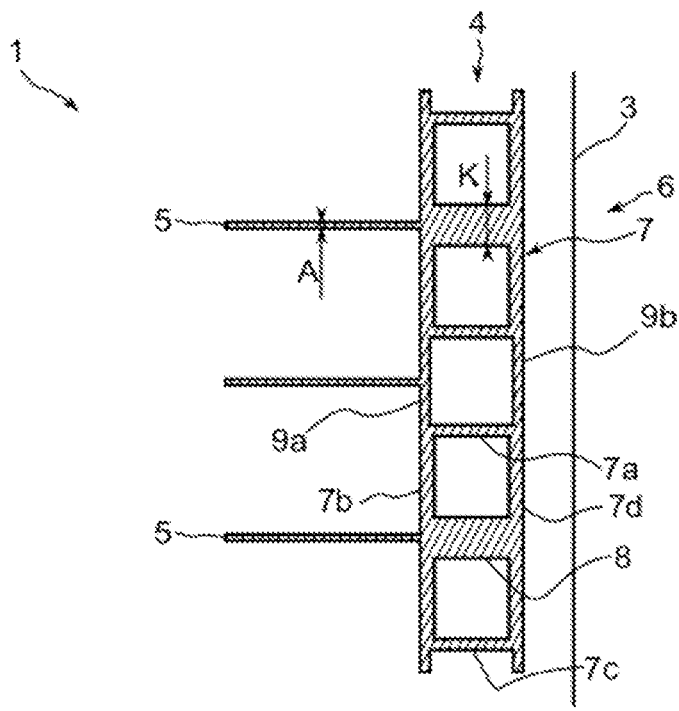

[Fig. 13]
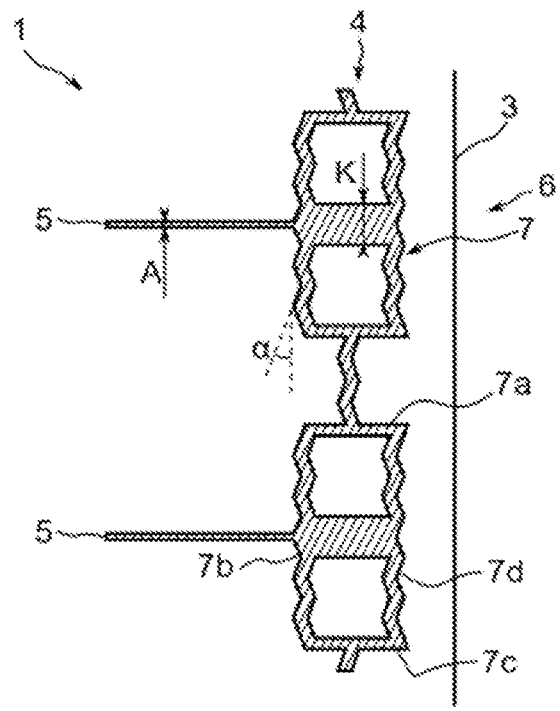
[Fig. 14]
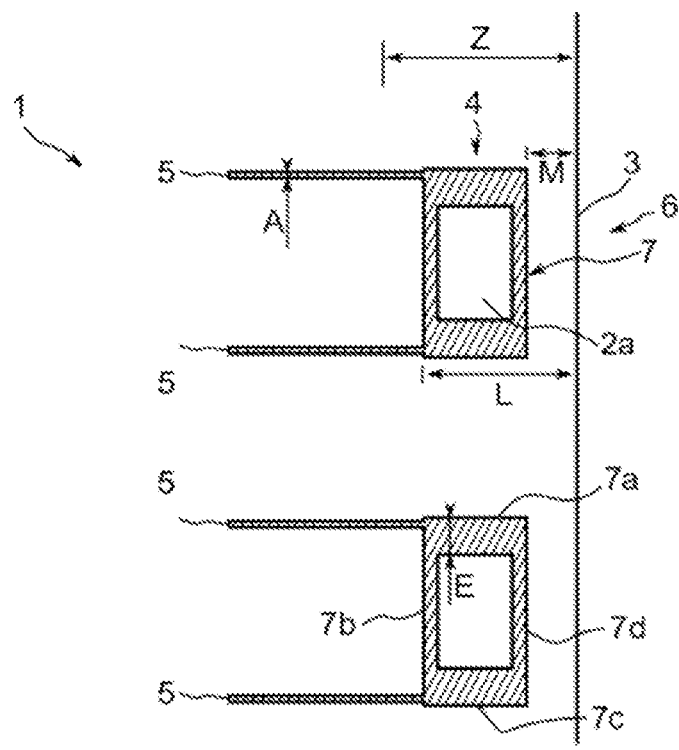

[Fig. 15]
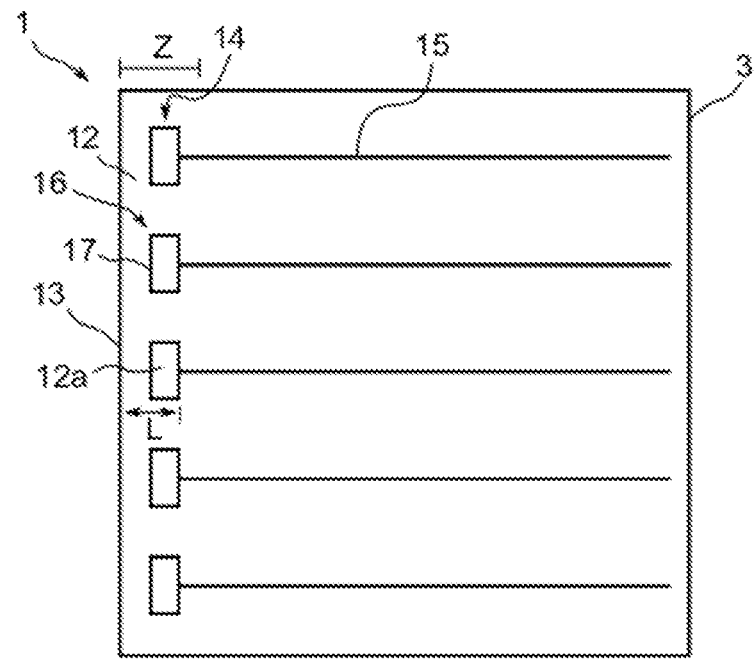
[Fig. 16]
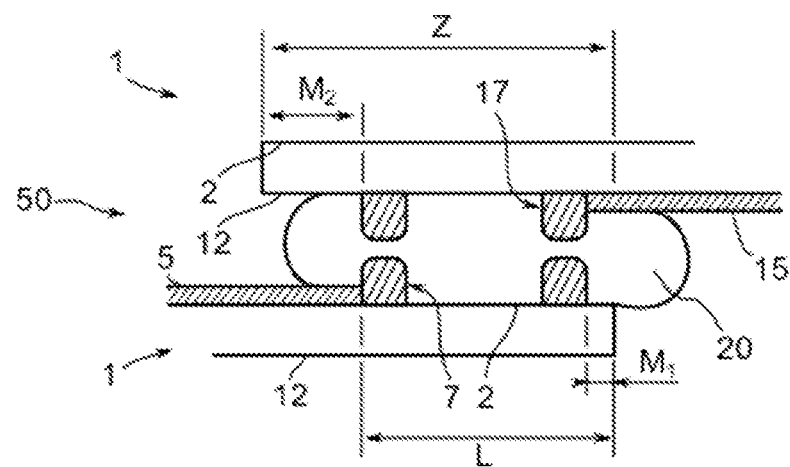

[Fig. 17]
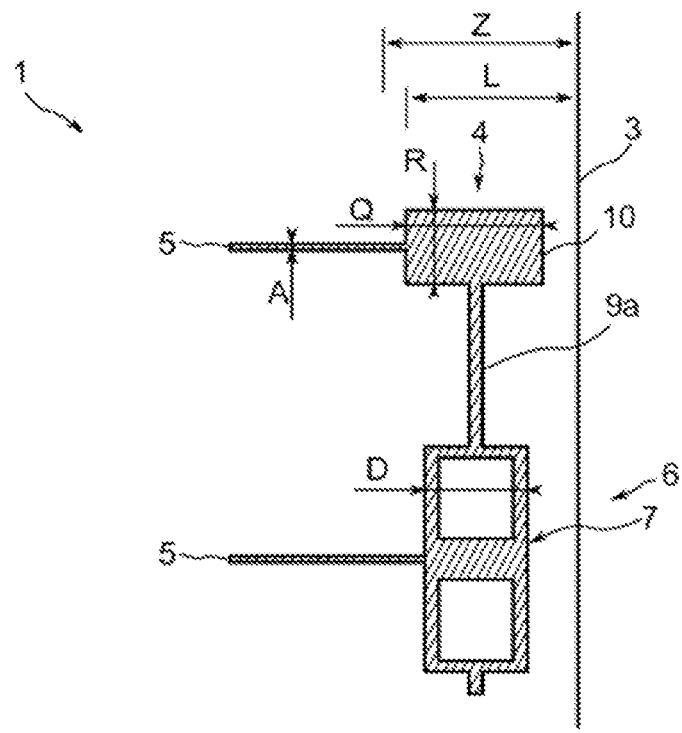
[Fig. 18]
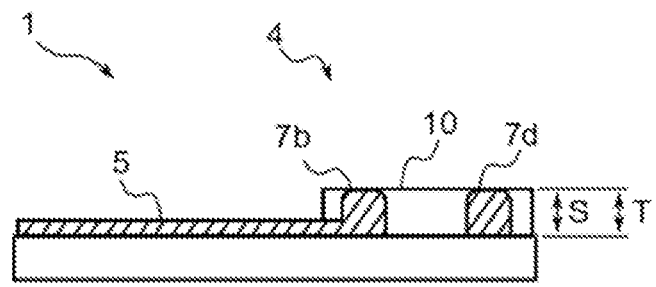
[Fig. 19]
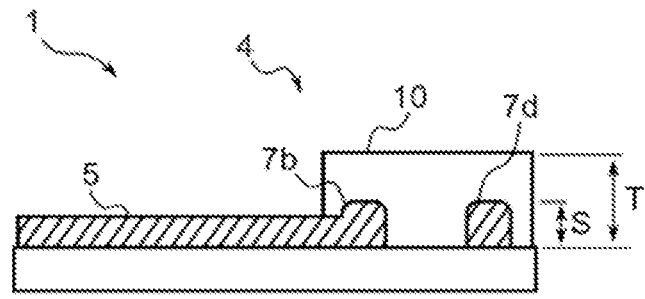

[Fig. 20]
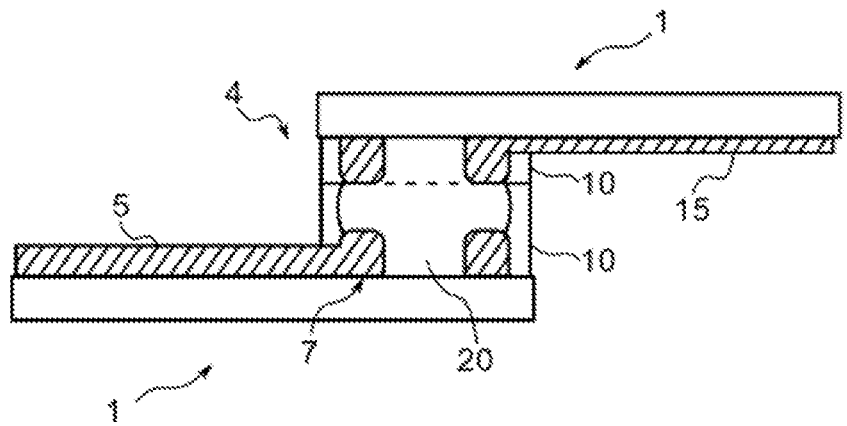
[Fig. 21]
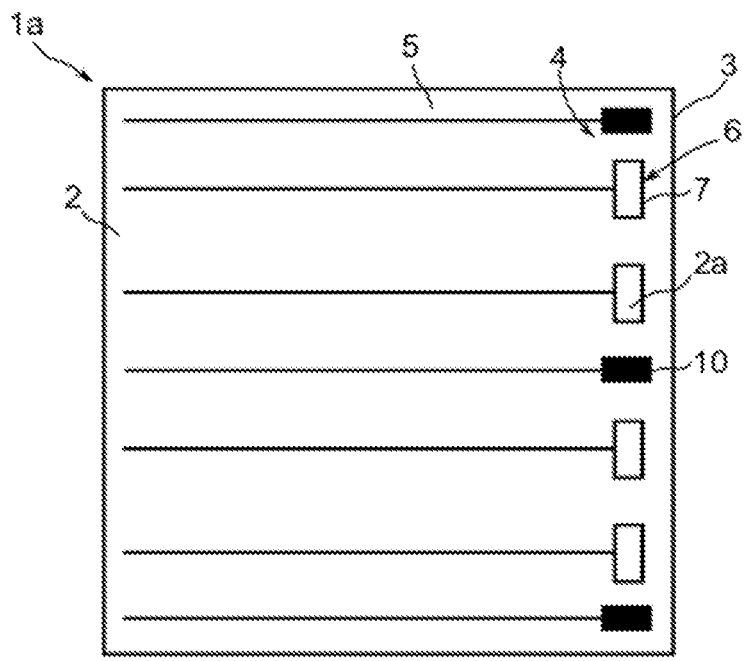

[Fig. 22]
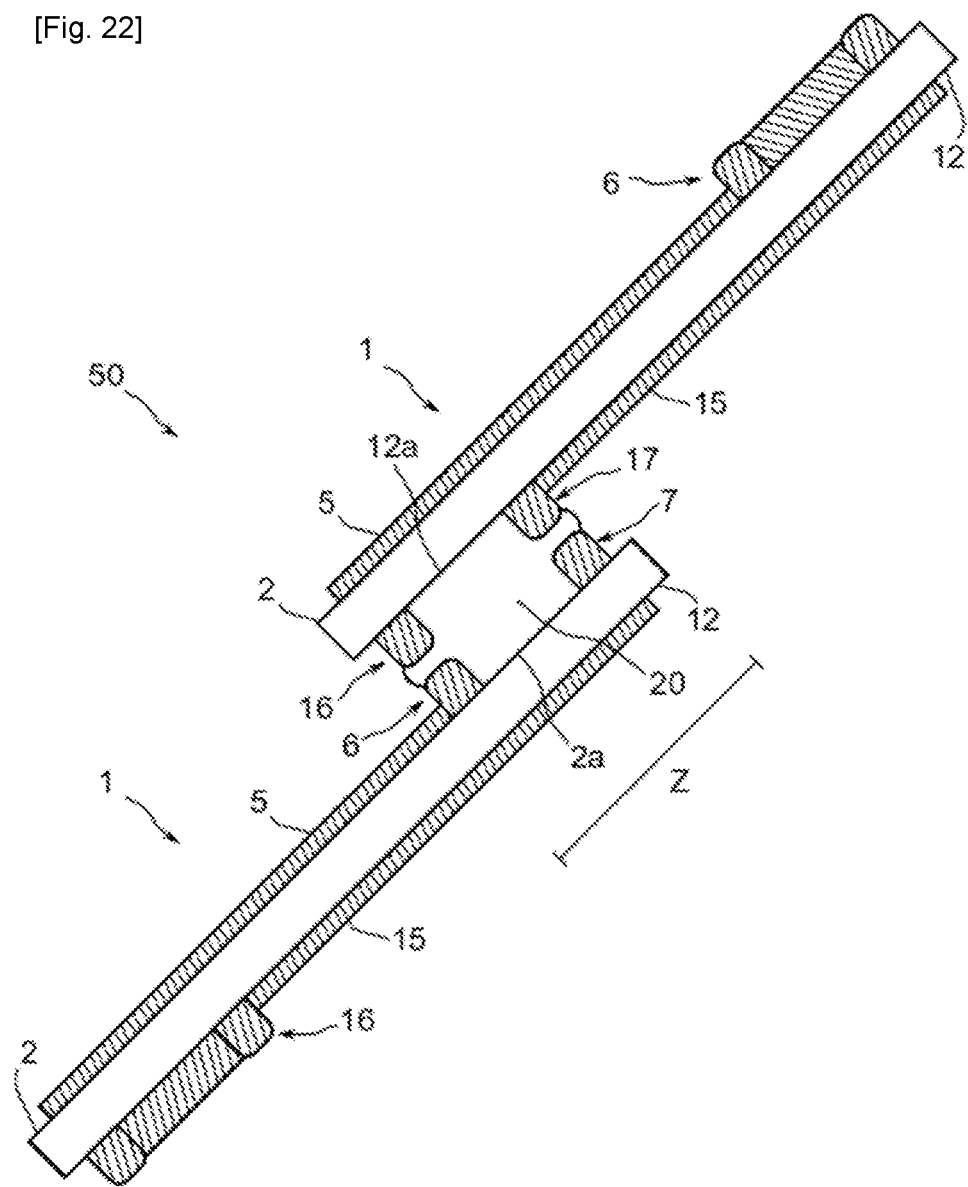

[Fig. 23]
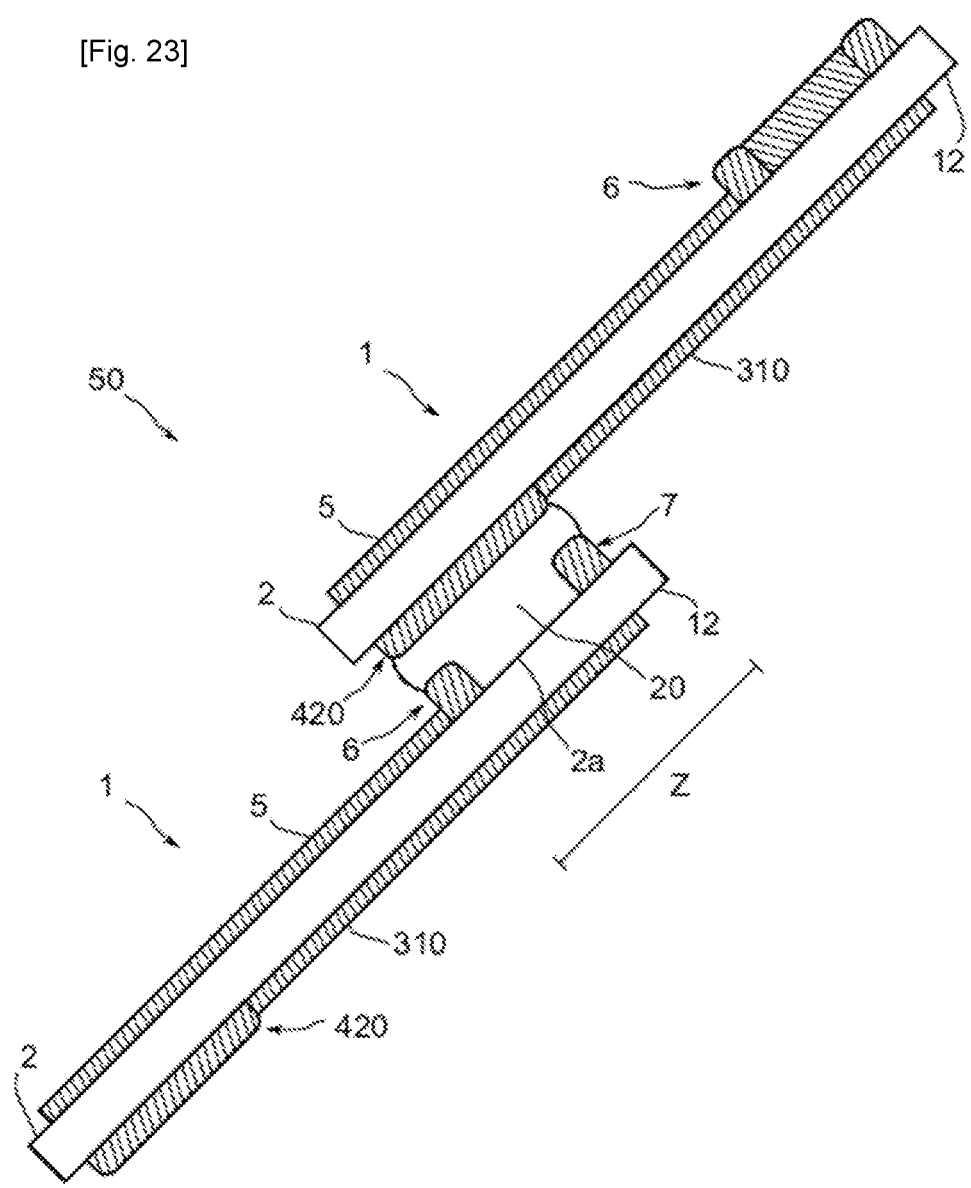
[Fig. 24]
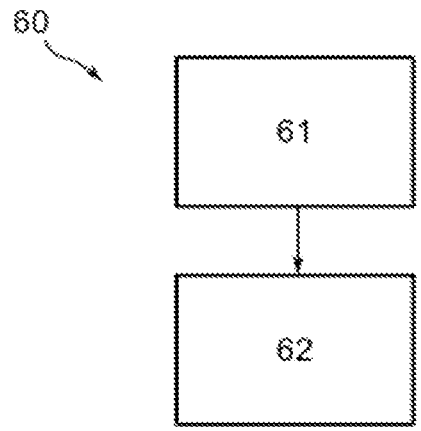

[Fig. 25]
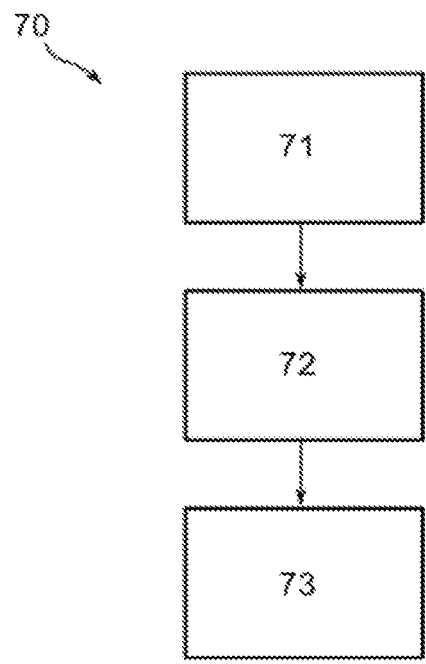
[Fig. 26]
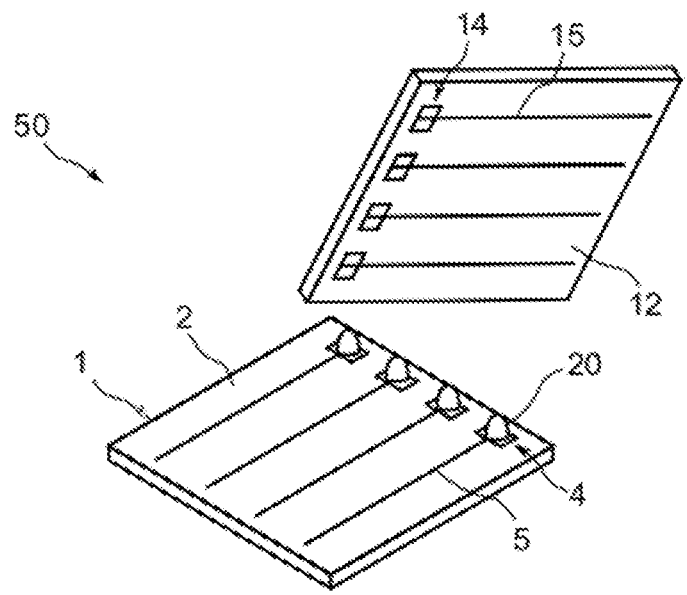

[Fig. 27]
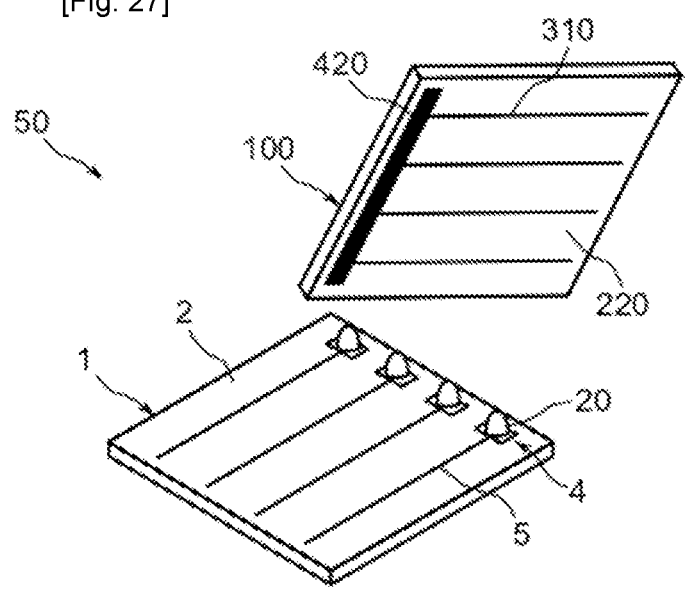
[Fig. 28]
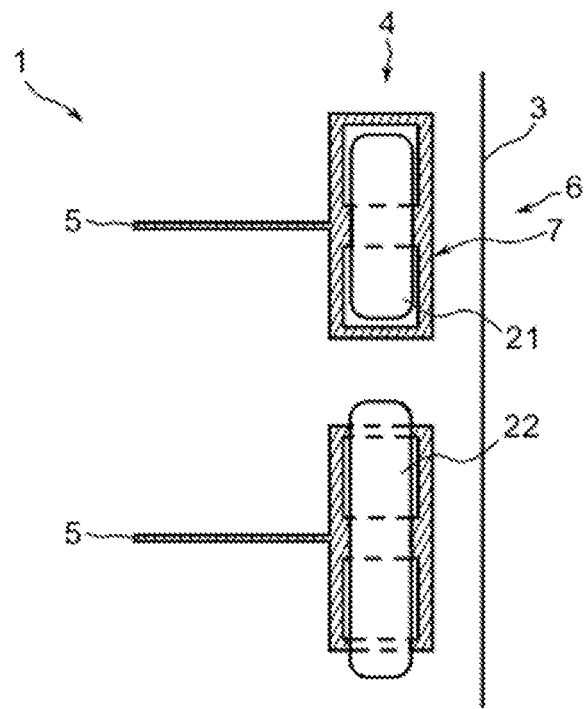

[Fig. 29]
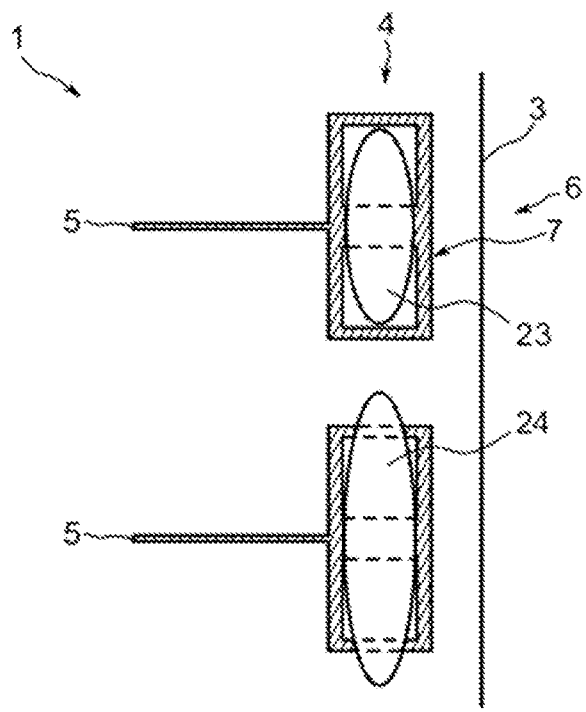
[Fig. 30]
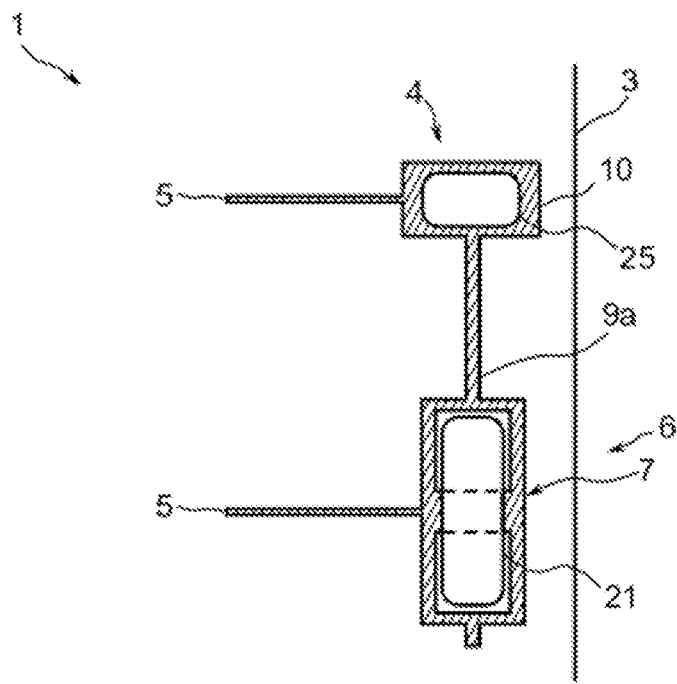

PHOTOVOLTAIC CELL AND STRING AND ASSOCIATED METHODS

CROSS-REFERENCE TO RELATED APPLICATIONS

This application is the U.S. National Stage of PCT/EP2021/063918, filed May 25, 2021, which in turn claims priority to French patent application number 2005603 filed May 27, 2020. The content of these applications are incorporated herein by reference in their entireties.

TECHNICAL FIELD OF THE INVENTION

The technical field of the invention is that of photovoltaic chains and modules made from photovoltaic cells partially covering each other. The invention more particularly relates to the electrical and mechanical connection of the photovoltaic cells within said photovoltaic modules and chains.

TECHNOLOGICAL BACKGROUND OF THE INVENTION

Photovoltaic modules are made by placing a plurality of photovoltaic cells in series, forming a photovoltaic chain, followed encapsulating the latter so as to form a photovoltaic module. The method commonly used for forming photovoltaic chains is welding or bonding tapes or wires to the collection fingers of the front face of a first cell and to the collection fingers of the back face of a second cell. The first and second cells are separated by a few millimeters, about 3 mm, so that the tape or wire can change planes from the front face of the first cell to the back face of the second cell. The spacing between the two cells increases the surface area of the chain thus formed and thus that of the final module.

There is a technique for interconnecting photovoltaic cells called "shingle" which does not use tapes or electrical wires, making it possible to increase the active surface area of the module. The "shingle" interconnection technique is for example described in the article ["Materials challenge for shingled cells interconnection", G. Beaucarne, Energy Procedia 98, pp. 115-124, 2016]. FIG. 1 schematically sets forth an example of an interconnected photovoltaic chain according to the "shingle" technique. The cells 100 forming the chain are superimposed on each other, with a lower cell 100 being partially covered with the adjacent upper cell 100, in the same way that shingles cover a roof. The interconnection between two adjacent cells is achieved in the coverage zone. The front face 210 of the lower cell and the back face 220 of the upper cell each include an array of collection fingers 310 connected to a wide metallised track 410, 420, extending along one edge. During interconnection of the chain, the two metallised tracks 410, 420 are electrically and mechanically connected by welding or by means of an electrically conductive adhesive disposed between the two metallised tracks 410, 420. The photovoltaic chains thus eliminate the separation between the cells, providing a continuous active surface area over the entire surface of the photovoltaic chain.

However, interconnected shingle photovoltaic chains pose new problems. First, the electrical and mechanical reliability of the photovoltaic module requires a large coverage zone between adjacent cells within the photovoltaic chain. A part of each cell, having undergone the entire functionalization method, is not illuminated by the sun's rays and is therefore not used. Today, methods for manufacturing photovoltaic chains require a coverage zone in the order of 1.5 mm for photovoltaic cells measuring 156 mm×156 mm, which corresponds to an unused surface area of photovoltaic cell of approximately 1%. Therefore, there is a need to reduce the coverage zone between adjacent cells to reduce unused surface area of each photovoltaic cell while maintaining good electrical and mechanical reliability.

The mechanical reliability of the chain is highly dependent on the quality of bonding between adjacent cells. Successive expansions, due to daily and seasonal temperature variations, put a lot of stress on interconnections. There is therefore a need to control mechanical quality of the assembly.

SUMMARY OF THE INVENTION

The invention provides a solution to the above-mentioned problems by making it possible to reduce the coverage zone between two adjacent photovoltaic cells in a photovoltaic chain, while providing good electrical and mechanical reliability.

The invention relates to a photovoltaic cell comprising a first face and a second face opposite to the first face, the first face comprising:
  an edge;
  an interconnection conductive track extending in parallel to the edge to within 1.3 mm; and
  a plurality of electrodes, referred to as "collection fingers" (also called "collecting fingers"), extending in parallel to each other and electrically connected to the interconnection track;
the interconnection conductive track comprising a plurality of spaced-apart closed-contour conductive patterns, each closed-contour conductive pattern comprising a closed contour surrounding a portion of the first face.

The closed-contour conductive patterns belonging to the interconnection conductive track are for accommodating portions of electrically conductive adhesive for bonding the photovoltaic cell to an adjacent photovoltaic cell, with the adjacent photovoltaic cell covering a part of the first face of the photovoltaic cell. The closed contours allow the adhesive to be retained and located when the adjacent photovoltaic cell is pressed, during assembly of the photovoltaic chain, against the first face of the photovoltaic cell. For each portion of adhesive, a first part of the adhesive is in contact with the metallised closed contour, while a second part of the adhesive is directly in contact with the substrate of the first face. Because the electrically conductive adhesive has a better level of adhesion to the substrate, the level of adhesion of the interconnection with the adjacent cell is thus improved.

With the same level of adhesion relative to prior art, the surface area of the closed-contour conductive patterns according to the invention can be reduced. It is advantageous to reduce the width of said conductive patterns, measured perpendicular to the edge, and to bring them closer to the edge, allowing the coverage zone between the photovoltaic cells to be reduced.

The adhesive, retained by the closed contour, contacts said closed contour during assembly of the photovoltaic chain, thus making electrical contact.

The spacing between the conductive patterns results in reducing the amount of conductive paste required to make the interconnection conductive track.

In addition to the characteristics just discussed in the preceding paragraph, the photovoltaic cell according to the invention may have one or more complementary characteristics from among the following, considered individually or in any technically possible combination.

Advantageously, the closed contour comprises first, second, third and fourth retention lines,
- the first and third retention lines being disposed facing each other;
- the second and fourth retention lines being disposed facing each other and each connecting the first and third retention lines.

Preferably, each closed-contour conductive pattern of at least some of the closed-contour conductive patterns is electrically connected to at least one collection finger.

Preferably, each closed-contour conductive pattern of at least some of the closed-contour conductive patterns comprises a conductive pad, located inside the closed contour and connected to the closed contour. More preferably, the conductive pad is located as an extension of a collection finger.

Advantageously, the interconnection conductive track further comprises a first conductive line electrically connecting two consecutive closed-contour conductive patterns. Preferably, the first conductive line electrically connects all closed-contour conductive patterns two by two.

Advantageously, the first conductive line is connected to at least one collection finger.

More advantageously, the interconnection conductive track further comprises a second conductive line electrically connecting all closed-contour conductive patterns two by two.

Advantageously, the interconnection conductive track comprises a spacing-ensuring pillar, the spacing-ensuring pillar having a height greater than or equal to the height of the closed-contour conductive patterns.

Advantageously, the spacing-ensuring pillar is connected to a collection finger and electrically connected to a closed-contour conductive pattern.

By height of the conductive patterns, it is meant the maximum height of all conductive patterns measured perpendicular to the first face.

Advantageously, the second face of the photovoltaic cell comprises:
- an edge, opposite to the edge of the first face;
- an interconnection conductive track extending in parallel to the edge to within 1.3 mm of the edge;
- a plurality of electrodes, referred to as "collection fingers," extending in parallel to each other and electrically connected to the interconnection track; and the interconnection conductive track of the second face comprising a plurality of spaced-apart closed-contour conductive patterns, each closed-contour conductive pattern comprising a closed contour surrounding a portion of the second face.

Advantageously, the interconnection conductive track of the first face is separated by a first distance from the edge of the first face and the interconnection conductive track of the second face is separated by a second distance from the edge of the second face, the second distance being strictly greater than the first distance.

Preferably, the first face is a front face and the second face is a back face.

The invention also relates to a photovoltaic chain comprising first and second photovoltaic cells comprising any of the preceding characteristics, the second photovoltaic cell being interconnected to the first photovoltaic cell, the second face of the second photovoltaic cell covering a zone of the first face of the first photovoltaic cell, called the "coverage zone", in which the interconnection conductive track is located.

Advantageously, the interconnection conductive track of the first photovoltaic cell is electrically connected to the second face of the second photovoltaic cell by means of a plurality of portions of electrically conductive adhesive, at least some of the portions of electrically conductive adhesive each electrically connecting a closed-contour conductive pattern of the interconnection conductive track of the first photovoltaic cell with a conductive element of the second face of the second photovoltaic cell, the plurality of portions of electrically conductive adhesive adhering to a plurality of portions of the first face of the first photovoltaic cell.

In the case where the second face of the second photovoltaic cell does not comprise an interconnection conductive track according to the invention, the volume of each portion of electrically conductive adhesive connecting a closed-contour conductive pattern is advantageously greater than or equal to 1.2 times the internal volume of said closed-contour conductive pattern.

Advantageously, the second face of the second photovoltaic cell comprises an additional interconnection conductive track comprising a plurality of additional closed-contour conductive patterns and wherein the interconnection conductive track of the first face of the first photovoltaic cell is electrically connected to the additional interconnection conductive track of the second face of the second photovoltaic cell by means of a plurality of portions of electrically conductive adhesive, at least some of the portions of electrically conductive adhesive each electrically connecting one of the conductive patterns of the first photovoltaic cell with one of the additional closed-contour conductive patterns of the second photovoltaic cell, the plurality of portions of electrically conductive adhesive adhering to a plurality of portions of the first face of the first photovoltaic cell and a plurality of portions of the second face of the second photovoltaic cell.

In the case where the back face of the second photovoltaic cell comprises an interconnection conductive track according to the invention, the volume of each portion of electrically conductive adhesive connecting one of the closed-contour conductive patterns and one of the additional closed-contour conductive patterns is greater than or equal to 1.1 times the sum of the internal volumes of the closed-contour conductive pattern and the additional closed-contour conductive pattern.

The invention also relates to a method for manufacturing a photovoltaic cell comprising any of the aforementioned characteristics, comprising the following steps of:
- forming on a face of a substrate an interconnection conductive track extending in parallel to an edge of the substrate to within 1.3 mm of the edge, the interconnection conductive track comprising a plurality of spaced-apart closed-contour conductive patterns, each closed-contour conductive pattern comprising a closed contour surrounding a portion of the substrate face; and
- forming a plurality of electrodes referred to as "collection fingers" extending in parallel to each other and electrically connected to the interconnection track.

The invention further relates to a method for manufacturing a photovoltaic chain comprising any of the aforementioned characteristics, the method comprising the following steps of:
- providing first and second photovoltaic cells having any of the aforementioned characteristics;
- depositing a portion of electrically conductive adhesive on at least some of the closed-contour conductive patterns of the interconnection conductive track of the first photovoltaic cell, the plurality of portions of electrically conductive adhesive thus formed adhering to a plurality of portions of the first face of the first photovoltaic cell; and interconnecting the second photovoltaic cell to the first photovoltaic cell, the second face of the second photovoltaic cell covering a zone of the first face of the first photovoltaic cell, called the "coverage zone," in which the interconnecting conductive track is located, the second face of the second photovoltaic cell being electrically and mechanically connected by means of the plurality of portions of electrically conductive adhesive.

The invention and its various applications will be better understood upon reading the following description and examining the accompanying figures.

BRIEF DESCRIPTION OF THE FIGURES

The figures are set forth for indicative and in no way limiting purposes of the invention.

FIG. 1 schematically sets forth a photovoltaic chain according to prior art.

FIG. 2 schematically sets forth a first embodiment of a photovoltaic cell according to the invention.

FIG. 3 schematically sets forth a cross-sectional view of the first embodiment of the photovoltaic cell.

FIG. 4 schematically sets forth an enlargement of the first embodiment of the photovoltaic cell.

FIG. 5 schematically sets forth a second embodiment of the photovoltaic cell.

FIG. 6 schematically sets forth a third embodiment of the photovoltaic cell.

FIG. 7 schematically sets forth a fourth embodiment of the photovoltaic cell.

FIG. 8 schematically sets forth a fifth embodiment of the photovoltaic cell.

FIG. 9 schematically sets forth a sixth embodiment of the photovoltaic cell.

FIG. 10 schematically sets forth a seventh embodiment of the photovoltaic cell.

FIG. 11 schematically sets forth an eighth embodiment of the photovoltaic cell.

FIG. 12 schematically sets forth a ninth embodiment of the photovoltaic cell.

FIG. 13 schematically sets forth a tenth embodiment of the photovoltaic cell.

FIG. 14 schematically sets forth an eleventh embodiment of the photovoltaic cell.

FIG. 15 schematically sets forth a twelfth embodiment of the photovoltaic cell.

FIG. 16 schematically sets forth an interconnection between two photovoltaic cells according to the twelfth embodiment.

FIG. 17 schematically sets forth a thirteenth embodiment of the photovoltaic cell.

FIG. 18 schematically sets forth a cross-sectional view of the thirteenth embodiment of the photovoltaic cell.

FIG. 19 schematically sets forth a cross-sectional view of a fourteenth embodiment of the photovoltaic cell.

FIG. 20 schematically sets forth an interconnection between two photovoltaic cells according to the fourteenth embodiment.

FIG. 21 schematically sets forth a fifteenth embodiment of the photovoltaic cell.

FIG. 22 schematically sets forth a first embodiment of a photovoltaic chain.

FIG. 23 schematically sets forth a second embodiment of the photovoltaic chain.

FIG. 24 schematically sets forth a method for manufacturing a photovoltaic cell according to the invention.

FIG. 25 schematically sets forth a method for manufacturing a photovoltaic chain according to the invention.

FIG. 26 schematically sets forth a first example of a step of the method for manufacturing a photovoltaic chain.

FIG. 27 schematically sets forth a second example of a step of the method for manufacturing a photovoltaic chain.

FIG. 28 schematically sets forth first and second examples of portions of electrically conductive adhesive.

FIG. 29 schematically sets forth third and fourth examples of the portions of electrically conductive adhesive.

FIG. 30 schematically sets forth a fifth and sixth example of the portions of electrically conductive adhesive.

DETAILED DESCRIPTION

The figures are set forth for indicative and in no way limiting purposes of the invention. Unless otherwise specified, a same element appearing in different figures has a unique reference.

FIGS. 2 to 15, 17 to 19 and 21 represent different embodiments of a photovoltaic cell 1 according to the invention. The characteristics of the photovoltaic cell 1 common to these different embodiments will be described with reference to FIG. 2.

The photovoltaic cell 1, which will also be referred to as the cell 1, is a semiconductor substrate, for example made of silicon, which makes it possible to convert light radiation, for example solar radiation, into electrical energy. The invention is applicable to substrates implementing so-called homojunction or heterojunction technologies. The surfaces of the cell 1 preferably comprise an insulating layer, for example of SiN, or a layer of transparent conductive oxide, or TCO, for example of indium-tin oxide.

The cell 1 may be square, as represented in FIG. 2, for example 156 mm by 156 mm, or preferably rectangular, for example 31.2 mm by 156 mm or 26 mm by 156 mm.

The cell 1 comprises a first face 2 and a second face 12, opposite to the first face 2. The first face 2 comprises:
an edge 3;
an interconnection conductor track 4 (also called conducting track or conductive track); and
a plurality of electrodes 5 referred to as "collection fingers" (also called collecting fingers).

The collection fingers 5 are for collecting electrical currents along the first face 2. The collection fingers 5 extend in parallel to each other along the first face 2 and are preferentially uniformly distributed across the first face 2. In order to carry electrical currents in a photovoltaic chain comprising several interconnected cells 1, the collection fingers 5 are electrically connected to the interconnection conductor track 4. The electrical connection to the interconnection conductor track 4 can be achieved by a direct connection to the track 4, as represented in FIG. 2, or via additional metallizations.

The edge 3 is represented on the right in the figures when the cell 1 is viewed from above. In the case of a rectangular cell 1, the edge 3 is preferably one of the long edges of the first face 2. The interconnection conductor track 4 extends in parallel to the edge 3. The interconnection conductor track 4 comprises a plurality of spaced-apart closed-contour conductor patterns 6 (also called closed-contour conducting patterns or closed-contour conductive patterns), forming a discontinuous track parallel to the edge 3. Each closed-contour conductor pattern 6 comprises a closed contour 7 surrounding a portion of the first face 2a.

Hereinafter and unless otherwise stated, for the sake of brevity, the term "conductor pattern" will refer to a "closed-contour conductor pattern".

The conductor patterns 6 have a metal character and may be made by screen-printing a conductive paste containing metal particles, for example silver.

Each conductor pattern 6 is for accommodating a portion of electrically conductive adhesive 20 in order to achieve an interconnection with an adjacent cell and the closed contour 7 is for retaining the portion of electrically conductive adhesive 20. In the embodiment of FIG. 3, schematically representing the cell 1 in cross-section, a portion of electrically conductive adhesive 20 is located on one of the conductor patterns 6. The portion of adhesive 20 is retained by the closed contour 7. Thus, the adhesive 20 is in contact with a part of the closed contour 7 and in direct contact with the portion of the first face 2a.

The electrically conductive adhesive 20 preferably comprises an epoxy or acrylate-based resin. The electrically conductive adhesive 20 exhibits two to three times better adhesion on a non-metallised layer compared to adhesion on a metallised layer, especially on heterojunction substrates with metallizations that have an increased risk of tearing. By non-metallised layer, it is meant for example the surface of the substrate of cell 1, for example the surface of the TCO layer. Thus, the level of adhesion within the interconnection tends to be increased by favoring contact of the electrically conductive adhesive 20 with the substrate. As the adhesive 20 is retained by the closed contour 7 and contacted with the substrate of cell 1, the level of adhesion is increased compared to an adhesive 20 deposited only on a metallised element.

The level of adhesion between two bodies corresponds to a mechanical resistance when attempting to separate the two bodies.

Interconnection by welding is limited by the wetting of molten materials that adhere only to the metallised elements. Conversely, the electrically conductive adhesive 20 adheres to the metallised elements as well as the substrate, without being limited by wetting. The use of electrically conductive adhesive 20 compared to welding allows the surface area of the metallised elements to be reduced, thus limiting the consumption of conductive paste without reducing the level of adhesion.

The level of adhesion depends on the surface area of the portion of the first face 2a in contact with the electrically conductive adhesive 20. The larger the surface area of the portion of the first face 2a, the greater the level of adhesion. With the same surface area portion of the first face 2a, that is, the same level of adhesion, the closed contours 7 may have different shapes. With reference to FIG. 4, the closed contours 7 advantageously have an external width D, measured perpendicular to the edge 3, that is smaller than their external length G, measured in parallel to the edge 3, in order to maintain a constant surface area portion of the first face 2a.

As the external width D of the closed contours 7 is reduced, the external width of the interconnection conductor track 4 is then also reduced. The interconnection conductor track 4 may also be moved closer to the edge 3. Thus, the interconnection conductor track 4 extends within a first distance L from the edge 3, the first distance L being equal to 1.3 mm. Advantageously, the external width D of the closed contours 7 can be further reduced and the interconnection track 4 can also advantageously be brought closer to the edge 3. Thus, in an alternative embodiment, the first distance L is equal to 0.8 mm or equal to 0.45 mm.

A zone called "coverage zone" corresponds to the zone covered with an adjacent photovoltaic cell when the cell 1 is interconnected with the adjacent photovoltaic cell. The coverage zone extends in parallel to the edge 3, along the entire length of the edge 3, and perpendicular to the edge 3, over a coverage distance Z, measured from the edge 3. The interconnection conductor track 4 extends within the coverage zone. The coverage distance Z is greater than or equal to the first distance L and preferably strictly greater than the first distance L. Due to the reduction in the external width of the interconnection conductor track, and considering an alignment margin of the cells during interconnection of between 50 µm and 200 µm, the coverage distance Z is, for example, equal to 1.5 mm in the case where the first distance L is equal to 1.3 mm. In the case where the first distance L is equal to 0.8 mm, the coverage distance Z may be equal to 1.0 mm. In the case where the first distance L is equal to 0.45 mm, the coverage distance Z may be equal to 0.5 mm.

The reduction in coverage distance, enabled by the improved mechanical adhesion, minimises the coverage zone, obscured by the adjacent cell. Thus, a larger surface area of the cell 1 contributes to the conversion of light radiation into electrical energy.

Improved adhesion also reduces the number of conductor patterns 6 required for interconnection with an adjacent cell. Thus, the amount of conductive paste used to manufacture the conductor patterns 6 as well as the amount of electrically conductive adhesive 20 tend to be reduced.

Mechanical adhesion is achieved largely through contact of the adhesive on the first face 2a. Mechanical stresses on the metallised elements, such as the conductor patterns, are thus reduced, thereby reducing the risk of peeling of the metallised elements. The invention is even more beneficial to heterojunction cells, whose adhesion of the metallised elements to the substrate is less than homojunction cells. The reduction in adhesion of the metallised elements to the substrate of heterojunction cells is due to the relatively low annealing temperature reached during their manufacture, below 250° C. The adhesion is then only provided by the resin contained in the conductive paste used to make the metallizations. The annealing temperature reached in the manufacture of homojunction cells is higher than 700° C. In this case, the adhesion is obtained by forming a glass within the conductive paste, providing better adhesion on the substrate.

The closed contours 7 retain the portions of electrically conductive adhesive 20 by limiting their outward creep, the closed contours 7 acting as a barrier. Thus, during assembly of the photovoltaic chain, the closed contours 7 strongly limit or even prevent the adhesive from flowing out of the coverage zone, reducing the risk of dripping on the first "active" face 2 of the photovoltaic cell 1.

In addition, the thickness of the portions of electrically conductive adhesive 20 is an important parameter with respect to the reliability of the interconnection because the adhesive 20 has to absorb the differential expansion stresses to which the photovoltaic chain is subjected as its temperature varies. In order for the absorption of the deformations to be homogeneous within each interconnection, the portions of adhesive 20 should have a thickness greater than or equal to a minimum thickness, the minimum thickness being greater than 20 µm and preferably between 30 µm and 40 µm. The closed contours 7, limiting creep of the portions of adhesive 20 during interconnection, make it possible to avoid too great a reduction in the thickness of said portions of adhesive 20 and thus ensures a compliant thickness.

FIGS. 4 to 21 schematically represent other embodiments of the cell 1, the figures being especially enlarged on at least two conductor patterns 6 of the interconnection track 4.

Similarly to the embodiments represented in FIGS. 4 through 12, each closed contour 7 comprises first, second, third, and fourth retention lines 7a, 7b, 7c, 7d. The first and third retention lines 7a, 7c are disposed facing each other. The second and fourth retention lines 7b, 7c are disposed facing each other and each connect the first and third retention lines 7a, 7c. The first and third retention lines 7a, 7b are advantageously perpendicular to the edge 3 and the second and fourth retention lines 7b, 7d are advantageously parallel to the edge 3. The closed contours 7 thus have a rectangular shape that makes it easy to optimise the width of the conductor patterns 4 while maintaining an identical portion surface area of first face 2a.

With reference to FIG. 4, each closed contour 7 has an external width D, measured perpendicular to the edge 3 and an external length G, measured in parallel to the edge 3. The external width D of the closed contour 7 may also be defined as the distance between the external edge of the second retention line 7b and the external edge of the fourth retention line 7d, with the external edges of the second and fourth lines 7b, 7d being the edges not facing each other. Similarly, the external length G of the closed contour 7 may also be defined as the distance between the external edge of the first retention line 7a and the external edge of the third retention line 7c, the external edges of the first and third retention lines 7a, 7c being the edges not facing each other.

Said external width and length D, G are preferably the same for all closed contours 7 of the interconnection track 4. The external width D is preferably between 300 μm and 1100 μm. The external length G is preferably between 700 μm and 1300 μm. For example, for a coverage distance Z equal to 1.0 mm, the external width D is preferably between 400 μm and 500 μm, preferably less than 600 μm, in order to have an alignment margin of at least 200 μm on either side of the closed contour 7.

Each closed contour 7 also has an internal width C, measured perpendicular to the edge 3, and an internal length F, measured in parallel to the edge 3. The internal width C can be defined as the distance between the internal edge of the second retention line 7b and the internal edge of the fourth retention line 7d, with the internal edges of the second and fourth lines 7b, 7d being the edges facing each other. Similarly, the internal length F may also be defined as the distance between the internal edge of the first retention line 7a and the internal edge of the third retention line 7c, with the internal edges of the first and third lines 7a, 7c being the edges facing each other.

The internal width and length C, F are preferably identical for all closed contours 7 of the interconnection track 4. The internal width C is preferably between 100 μm and 1000 μm. The internal length F is preferably between 500 μm and 1200 μm.

The surface area of the portion of the first face 2a is equal to the product of the internal width C and the internal length F, and is preferably between 0.05 mm$^2$ and 1.2 mm$^2$.

The interconnection conductor track 4 is separated from the edge 3 by a separation distance M. The separation distance M is between 50 μm and 200 μm in order to allow for tolerance when making the conductor patterns 6 or when positioning an adjacent cell in order to make the interconnection. The closed contours 7, and thus the interconnection track 4, extend in a strip parallel to the edge 3, separated from the edge 3 by the separation distance M and extending to within the first distance L, the first distance L being equal to the separation distance M plus the external width D of the closed contours 7.

The width B of the second and fourth retention lines 7b, 7d, measured perpendicular to the edge, is less than twice the width A of a collection finger, measured in parallel to the edge. The second and fourth retention lines 7b, 7d need not be very wide since they scarcely contribute to mechanical adhesion. The primary role of the second and fourth retention lines 7b, 7d is to limit creep of the adhesive 20 in a direction perpendicular to the edge. Thus, making the second and fourth retention lines 7b, 7d narrow for a same external width D of closed contours 7 increases the internal width C and thus the surface area of the portions of the first face 2a surrounded by the closed contours 7, further improving adhesion. Making the second and fourth retention lines 7b, 7d narrow also further reduces the external width D of the closed contours and thus of the interconnection conductor track 4, further minimizing the coverage distance Z. When the width A of the collection fingers 5 is for example 50 μm, the second and fourth retention lines 7b, 7d advantageously have a width B of less than 100 μm. For example, for a coverage distance Z equal to 0.5 mm, the second and fourth retention lines 7b, 7d have a width B equal to 50 μm.

In the embodiments of FIGS. 5 to 13, at least some of the conductor patterns 6 each comprise a conductor pad 8 (also called conductive pad), located inside the closed contour 7 and connected to the closed contour 7. Preferably, each of the conductor patterns 6 of the interconnection track 4 comprises a conductor pad 8. The conductor pad 8 reduces resistive losses within the interconnection conductor track 4. During interconnection, the portion of electrically conductive adhesive 20 that is deposited on the conductor pattern 6 is in contact with a part of the closed contour 7. In the presence of the conductor pad 8, the surface of the conductor pad 8 is covered with the portion of adhesive 20 thus making additional electrical contact.

The conductor pad 8 is preferably oriented perpendicular to the edge 3, passing through the portion of the first face 2a on either side. The conductor pad 8 thus divides the portion of the first face 2a into two sub-portions of the first face. Preferably, the surface areas of the two sub-portions are equal.

The conductor pad 8 has a width K, measured in parallel to the edge, greater than 1.5 times the width A of a collection finger 5. When the width A of a collection finger 5 is for example 50 μm, the conductor pad 8 has a width greater than 75 μm. However, in order to further reduce the resistive losses within the interconnection track 4, the conductor pad 8 may have a width K greater than twice the width A of a collection finger 5 and preferably equal to 2.4 times the width A of a collection finger 5. For example, when the width A of a collection finger 5 is equal to 50 μm, the conductor pad 8 can have a width K equal to 120 μm, (that is, 2.4 times the width A of a collection finger). The latter case is represented in the embodiments of FIGS. 7 and 9 to 13.

When a collection finger 5 is connected to a conductor pattern 6 as illustrated in FIGS. 5 to 10 and 12 to 13, the conductor pad 8 is preferably located as an extension of the collection finger 5, in order to reduce the path travelled by the electric current from the collection finger 5 to the portion of adhesive 20.

When the conductor pad 8 has a width K less than twice the width A of a collection finger 5, as illustrated in FIG. 8, or when there is no conductor pad 8, as illustrated in FIG. 14, the first and third retention lines 7a, 7c can advantageously have a width E, measured in parallel to the edge 3, greater than 1.5 times the width A of a collection finger 5. According to this configuration, the first and third retention lines 7a, 7c each have a surface for improving the electrical conductivity, compensating for the absence of the conductor pad 8 or a narrow conductor pad 8 (that is, with a width A less than twice the width A). During interconnection of the cell 1, care will be taken moreover to cover the first and third retention lines 7a, 7c with a layer of electrically conductive adhesive 20 in order to make electrical contact. More advantageously, the first and third retention lines 7a, 7c can have a width E equal to 2.4 times the width A of a collection finger 5, making it possible to further improve electrical conductivity. When the width A of the collection fingers 5 is for example 50 µm, the first and third retention lines 7a, 7c have a width greater than 100 µm, preferably equal to 120 µm.

When the conductor pad 8 has a width K equal to 2.4 times the width A of a collection finger 5, as illustrated by FIGS. 7, 9, 10 to 13, the first and third retention lines 7a, 7c advantageously have a width E less than or greater than twice the width A of a collection finger 5. In this way, the first and third retention lines 7a, 7c limit creep of the adhesive 20 in parallel to the edge 3 while increasing the surface area of the portion of the first surface 2a surrounded by the closed contour 7. When the width A of the collection fingers is, for example, 50 µm, the first and third retention lines 7a, 7c may have a width E between 50 µm and 100 µm.

In the embodiments of FIGS. 9 to 13, the interconnection conductor track 4 comprises a first conductor line 9a (also called conductive line), electrically connecting a first conductor pattern 6 with a second consecutive conductor pattern 6. The first conductor line 9a connects the closed contour 7 of the first pattern 6 with the closed contour 7 of the second pattern 6. The conductor line 9a preferably connects the first retention line 7a of the first conductor pattern 6 (at the bottom in the figures) with the third retention line 7c of the second conductor pattern 6 (at the top in the figures), the conductor line 9a preferably being parallel to the edge 3.

Preferably, the first conductor line 9a is a discontinuous line electrically connecting all conductor patterns 6 two by two. It comprises several portions, each portion of the first conductor line 9a connecting two consecutive conductor patterns 6. Thus, by means of the first conductor line 9a, the interconnection conductor track 4 is continuous, facilitating the measurement of electrical characteristics I(V) of the cell 1. In the case of a discontinuous interconnection track 4, it is necessary to use a specific so-called "busbarless" device connecting each conductor pattern 6.

In order to facilitate the interconnection of cells whose number of collection fingers 5 is not identical to the number of conductor patterns 6, the first conductor line 9a is advantageously connected to at least one collection finger 5. Preferably, each portion of the first conductor line 9a is connected to at least one collection finger 5.

In this way, it is possible to connect collection fingers 5 without increasing the number of conductor patterns 6. The electric current from a collection finger 5 flows to the nearest conductor patterns 6 via the first conductor line 9a. This characteristic is particularly advantageous because, on the one hand, it makes it possible to limit the number of conductor patterns 6 and thus limit the number of portions of electrically conductive adhesive 20, and on the other hand, it makes it possible to connect the cell 1 with an adjacent cell comprising a same number of conductor patterns 6 but a different number of collection fingers 5.

In the embodiments of FIGS. 12 and 13, a second conductor line 9b electrically connects the first conductor pattern 6 with the second conductor pattern 6. Preferably, the second conductor line 9b electrically connects all conductor patterns 6 two by two. The second conductor line 9b thus duplicates the first conductor line 9a. It is preferably also parallel to the edge 3. The second conductor line enhances the electrical conductivity of the interconnection conductor track 4.

The first and second conductor lines 9a, 9b are preferably disposed on either side of the first and third retention lines 7a, 7c. During assembly of the cell 1 within a chain, part of the electrically conductive adhesive 20 may flow out of the closed contour 7. Due to the first and second conductor lines 9a, 9b, the electrically conductive adhesive 20 flowing over the first and third retention lines 7a, 7c is guided in parallel to the edge 3, limiting the risk of dripping on the first face.

In the embodiment of FIG. 13, the second and fourth retention lines 7b, 7d, as well as the first conductor lines 9a, if any, are not rectilinear but have a broken line (or zig-zag) shape. These lines 7b, 7d, 9a comprise short segments, in the order of 100 µm in length, tilted at an angle α with respect to the edge 3.

This embodiment applies to elements screen-printed on the cell 1 by means of a screen-printing screen whose component wires are parallel to the collection fingers 5, also known as 0° screen-printing or "knotless printing". With this screen-printing screen, it is not possible to screen-print elements perpendicular to the collection fingers 5. On the other hand, the shape of a broken line can be achieved with this technology. However, in order to limit the total width of the second and fourth retention lines 7b, 7d and the first conductor lines 9a, measured perpendicular to the edge 3, the absolute value of the angle α is between 10° and 30° and preferably between 10° and 15°.

Preferably, at least some of the conductor patterns 6 are each electrically connected to one or more collection fingers 5. In the embodiments of FIGS. 4, 5, 7 to 10, 12 and 13, each conductor pattern 6 is electrically connected to a collection finger 5. The electrical connection is preferably achieved by a direct connection of each conductor pattern 6 to the collection finger 5. When the conductor patterns 6 each comprise a conductor pad 8, a collection finger 5 is preferentially connected to each conductor pattern 6, as an extension of the conductor pad 8.

In the embodiments of FIGS. 6 and 14, each conductor pattern 6 is electrically connected to a plurality of collection fingers 5. These embodiments are especially attractive when the first face 2 comprises a large number of collection fingers 5. In order to avoid increasing the number of conductor patterns 6, it is therefore preferred to connect several collection fingers 5 to each conductor pattern 6.

In the embodiments of FIGS. 10 and 11, each portion of the first conductor line 9a is connected to a collection finger 5. Each portion of the first conductor line 9a may moreover advantageously be connected to a plurality of collection fingers 5. The currents from the collection fingers 5 flow through the first conductor line 9a to the nearest conductor patterns 6. Thus, it is possible to reduce the number of conductor patterns 6 within the interconnection conductor track 4, making it possible to reduce the amount of conductive paste needed to make them, as well as the amount of electrically conductive adhesive 20 needed to interconnect them. These embodiments are also attractive when the first face 2 comprises a large number of collection fingers 5. In order to avoid increasing the number of conductor patterns 6, it is therefore preferred to connect several collection fingers 5 to each portion of the first conductor line 9a The embodiment shown in FIG. 11 is an alternative of the embodiment shown in FIG. 10. In this alternative embodiment, the conductor patterns 6 are not directly connected to any collection fingers 5. The collection fingers 5 are connected only to the portions of the first conductor line 9a. This alternative is attractive if the positions of the conductor patterns 6 and the collection fingers 5 are restricted, for example by interconnection with a particular adjacent cell, and if the patterns 6 and the fingers 5 cannot be aligned.

In the embodiment of FIG. 15, the second face 12 of the photovoltaic cell 1 comprises conductive elements similar to the first face 2, that is:
- an edge 13, opposite to the edge 3 of the first face 2;
- an interconnection conductor track 14 extending in parallel to the edge 13 to within 1.3 mm of the edge 13, comprising a plurality of spaced-apart closed-contour conductor patterns 16, each closed-contour conductor pattern 16 comprising a closed contour 17 surrounding a portion of the second face 12a; and
- a plurality of electrodes 15 referred to as collection fingers, extending in parallel to each other and electrically connected to the interconnection conductor track 14.

The second face 12 including conductor patterns 16 similar to the conductor patterns 6 of the first face 2 covers, for example, applications of photovoltaic cells 1 whose first and second faces 2, 12 allow for the conversion of light radiation into electrical energy, also referred to as bifacial cells. The interconnection conductor track 14 of the second face 12, comprising the conductor patterns 16 with closed contours 17, provide the same technical advantages as the interconnection conductor track 4 of the first face 2, comprising the conductor patterns 6 with closed contours 7. The closed contours 17 surrounding a portion of the second face 12a improves the adhesion of the adhesive to the second face 12 and thus reduces the coverage distance Z during interconnection.

The first face 2 is preferably the front face and the second face 12 is preferably the back face. The front face is defined as the face that allows the cell 1 to produce the greatest electric current when illuminated, that is, oriented toward a radiation source. Conversely, the back face is defined as the face that allows the cell 1 to produce the smallest current when oriented toward the radiation source. For example, in the case of so-called "monofacial" cells, the back face produces no current.

In the embodiment of FIG. 16, which shows the interconnection between two identical photovoltaic cells 1, the interconnection conductor track 4 of the first face 2 is separated by a first distance $M_1$ from the edge 3 of the first face 2 and the interconnection conductor track 14 of the second face 12 is separated by a second distance $M_2$ from the edge 13 of the second face 12. The second distance $M_2$ may be equal to the first distance $M_1$, so that the interconnection conductor tracks 4, 14 of the first and second faces 2, 12 are centered within the coverage zone.

The second distance $M_2$ may advantageously be strictly greater than the first distance $M_1$. In this way, the interconnection conductor tracks 4, 14 of the first and second faces 2, 12 are offset within the coverage zone, that is, brought closer to the edge 3 of the first face 2. When the electrically conductive adhesive 20 spills over, it reaches the edge 3 of the first face 2 before reaching the edge 13 of the second face 12. Thus, if a drip forms, it forms on the second face 13 and not on the first face 3. Considering the aforementioned example where the second face 12 is a back face, then a drip on the second face 12 will have less impact on the overall electrical power generation of the cell 1.

In order to ensure tolerance during the manufacture of the interconnection tracks 4, 14 or during the removal of portions of adhesive 20, the first distance $M_1$ is preferably greater than or equal to 50 μm.

The electrically conductive adhesive 20 is more ductile than the welding joints, thus it can absorb the deformations dictated by the expansion stresses of the photovoltaic cells within the photovoltaic chain. So that the distribution of mechanical stresses is uniform within each cell interconnection and to prevent failures, it is preferable that the thickness of the adhesive 20 be identical between all interconnections within the photovoltaic chain and at least greater than or equal to a minimum thickness, the minimum thickness being greater than 20 μm. The closed contours 7, retaining the adhesive 20 and preventing drips, allow the thickness of the adhesive 20 within each cell interconnection to be controlled. However, depending on the pressure exerted on the cells during interconnection, the final thickness of the adhesive 20 may vary.

In the embodiments of FIGS. 17 to 21, the interconnection conductor track 4 comprises at least one spacing-ensuring pillar 10. The spacing-ensuring pillar 10 has a height T greater than or equal to the height S of the conductor patterns 6. Thus, each spacing-ensuring pillar 10 sets a reference height T. During interconnection, the adjacent cell comes to bear on the spacing-ensuring pillar 10, corresponding to a minimum thickness of electrically conductive adhesive 20. As the thickness of the adhesive 20 is controlled, the mechanical behavior of the interconnection between adjacent cells is also controlled. The reliability of the photovoltaic chain with respect to daily and seasonal expansion is thus improved.

The height S of the conductor patterns 6 refers to the maximum height of all conductor patterns 6 measured perpendicular to the first face 2.

In the embodiment of FIG. 17, a first spacing-ensuring pillar 10 is disposed at a first end of the interconnection conductor track 4. The interconnection conductor track 4 preferably comprises a second spacing-ensuring pillar 10 at a second, opposite end of the interconnection conductor track 4. The first spacing-ensuring pillar 10 has, when viewed from above, a solid rectangle shape. The width Q, measured perpendicular to the edge 3, and the length R, measured in parallel to the edge 3, of the first spacer pillar 10 result in a flat surface, free of defects due to the manufacturing method. In fact, screen-printing a large surface results in a thicker metallization and a flatter surface than the conductor patterns 6. This is especially because printing is more difficult on very narrow elements, such as the retention lines, than on wide elements, such as the pillars. In addition, the thickness of the narrower elements will be less than that of the wider elements. The width Q of the first pillar 10 is for example greater than or equal to 400 μm and the length R of the first pillar 10 is for example greater than or equal to 300 μm.

Preferably, each spacing-ensuring pillar 10 is electrically connected to a collection finger 5. Even more preferably, each spacing-ensuring pillar 10 is electrically connected to an adjacent conductor pattern 6, for example by an additional portion of the first conductor line 9a. The first spacing-ensuring pillar 10 is then electrically connected to a collection finger 5 and to the first conductor line 9a. Thus, the interconnection conductor track is continuous and allows a measurement of a characteristic I(V) of the cell 1 without specific means, such as a busbarless tool.

Between the embodiments of FIGS. 18 and 19, the height T of the spacing-ensuring pillar 10 differs. In the embodiment of FIG. 18, the height T of the spacing-ensuring pillar 10 is equal to the height S of the conductor pattern 6. In the embodiment of FIG. 19, the height T of the spacing-ensuring pillar 10 is greater than the height S of the conductor pattern 6, for example equal to twice the height S of the conductor pattern 6.

In the embodiment of FIG. 20, which shows the interconnection between two identical photovoltaic cells 1, the first face 2 comprises a first spacing-ensuring pillar 10 having a height T equal to twice the height S of the conductor pattern 6 and the second face 12 comprises a second spacing-ensuring pillar 10 having a height T equal to the height S of the conductor pattern 16. Thus, during interconnection of the second cell 1 to the first cell 1, the electrically conductive adhesive 20 disposed on each conductor pattern 6 is not overly crushed and has an identical height on each conductor pattern 6.

In the embodiment of FIG. 21, the interconnection conductor track 4 comprises a plurality of spacing-ensuring pillars 10 distributed along the interconnection conductor track. The interconnection conductor track 4 includes, for example, 3 spacing-ensuring pillars 10 or 5 spacing-ensuring pillars 10. Preferably, each end of the interconnection conductor track 4 comprises a spacing-ensuring pillar 10, for limiting a tilt of the adjacent cell during interconnection. Each spacing-ensuring pillar 10 is preferably connected to a collection finger 5.

FIG. 24 schematically represents an implementation of a method for manufacturing 60 the photovoltaic cell 1 according to the embodiments of FIGS. 2 to 21. A first step 61 of the manufacturing method 60 is to form the interconnection conductor track 4 on a face of a substrate. The interconnection conductor track 4 can be made by the various metallization methods used for metallizing photovoltaic cells, including screen-printing of the conductive paste containing silver-based metal particles through a screen-printing screen comprising wires of very low diameter, less than or equal to 16 μm, to allow for narrow prints.

A second step 62 of the manufacturing method 60 is to form the collection fingers 5. The collection fingers 5 may be made by screen-printing the conductive paste.

When the conductor patterns 6 of the interconnection conductor track 4 and the collection fingers 5 have the same thickness within 5%, the interconnection conductor track 4 and the collection fingers 5 can be formed simultaneously. The first step 61 and the second step 62 are then accomplished simultaneously.

The collection fingers 5 span a large part of the width of the first face 2. In order to reduce the resistive losses within the collection fingers 5, the collection fingers 5 can be screen-printed in two steps, thus forming so-called "double print" collection fingers 5. In this way, the cross-section of the collection fingers 5 is increased, thus reducing resistive losses. The double print screen-printing is preferably implemented for the collection fingers 5 of the front face of the substrate. The interconnection conductor track 4 can in this case be formed at the same time as the first printing step of the collection fingers 5.

The spacing-ensuring pillars 10 may also benefit from double print screen-printing, especially allowing for higher pillars 10 to be screen-printed, as illustrated in FIG. 19, where the height T of the spacing-ensuring pillar 10 is equal to twice the height S of the conductor pattern 6, the conductor pattern 6 having been screen-printed in a single layer.

FIGS. 22 and 23 represent two embodiments of a photovoltaic chain 50.

The photovoltaic chain 50 comprises at least a first photovoltaic cell 1 and a second photovoltaic cell 1. The first and second photovoltaic cells 1 are preferably identical. The number of first and second photovoltaic cells 1 may naturally be greater than 2.

FIGS. 22 and 23 represent the photovoltaic chain 50 in cross-section, with the section plane passing through one of the conductor patterns 6 on the first face 2 of the first cell 1 and through a conductive element 14, 420 on the second face 12 of the second cell 1.

The first cell 1 is interconnected to the second cell 1. The second face 12 of the second cell 1 covers a zone on the first face 2 of the first cell 1. The covered zone is the previously described "coverage zone" extending over a coverage distance Z between the edge 3 of the first face 2 of the first cell 1 and the edge 13 of the second face 12 of the second cell 1. The interconnection conductor track 4 of the first face 2 of the first cell 1 is located in the coverage zone. The interconnection conductor track 4 of the first face 2 is electrically and mechanically connected to the conductive element 14, 420 of the second face 12 by means of a plurality of portions of electrically conductive adhesive 20. All or some of the portions of electrically conductive adhesive 20 are located on the conductor patterns 6 of the interconnection conductor track 4. Each of the relevant portions of electrically conductive adhesive 20 electrically connects a conductor pattern 6 of the first face 2a to the interconnection element 16, 420 of the second face. Preferably, each conductor pattern 6 of the first face 2 is electrically connected to the interconnection element 16, 420 of the second face by a portion of electrically conductive adhesive 20.

Each portion of electrically conductive adhesive 20 located on a conductor pattern 6 adheres to at least one portion of the first face 2a. Due to the adhesion on the portion of the first face 2a, the invention partially improves the mechanical contact between the first and second cells 1, even in the case where the portions of electrically conductive adhesive 20 adhere only to a metallised surface of the conductive element 14, 420, as illustrated in FIG. 23. In this way, the coverage distance Z can be reduced. Connection of only conductive elements 14, 420 is preferred for homojunction cells whose metallizations have a lower risk of tearing due to thermal treatment of the conductive paste to form a glass.

The electrically conductive adhesive 20 preferably comprises an organic material capable of crossconnecting upon thermal treatment for a few seconds to a few minutes at a temperature between 120° C. and 200° C., such as epoxy, acrylate or silicone. The organic material is loaded with a conductive material such as a powder of metal or metallised particles on the surface. Copper-based metal particles are not chemically stable enough, risking oxidation, and are at least coated with a silver layer to stabilise them. Nickel- or silver-based metal particles give the best performance.

The electrically conductive adhesive 20 advantageously comprises a ratio of metal or metallised particles between 50% and 90%, in order to achieve a low-resistive interconnection, especially when the metallised elements of the cell 1 have a small surface area. A ratio of metal particles between 50% and 60% provides sufficient electrical conductivity while limiting the cost of the adhesive.

In the embodiment of FIG. 22, the second face 12 of the second cell 1 comprises an additional interconnection conductor track 14 disposed in the coverage zone opposite to the interconnection conductor track 4 of the first face 2 of the first cell 1. The additional interconnection conductor track 14 comprises a plurality of additional conductor patterns 16.

Of the portions of electrically conductive adhesive 20 each electrically connecting one of the conductor patterns 6 of the first face 2a, each of said portions of electrically conductive adhesive 20 also electrically connects one of the additional conductor patterns 16 of the second face 12.

Each of these portions of electrically conductive adhesive 20 then adheres to a portion of the first face 2a and a portion of the second face 12a. The adhesive in contact with the portions of the first and second faces 2a, 12a thus improves the mechanical contact within the interconnection between the first and second photovoltaic cells 1. Since the mechanical adhesion is optimal due to the portion of adhesive adhering to each portion of the first and second faces 2a, 12a, the coverage distance Z can then be reduced.

In order to completely fill the internal volume of each conductor pattern 6, 16 of the first and second faces 2, 12 with the electrically conductive adhesive 20, so that the portions of the first and second faces 2a, 12a are completely covered and effectively participate in the adhesion, the volume of each portion of electrically conductive adhesive 20 is preferably greater than or equal to 1.1 times the sum of the internal volumes of the conductor patterns 6, 16 connected by said portion of electrically conductive adhesive 20.

In the embodiment of FIG. 23, the second face 12 of the second cell 1 comprises a metallised track 420 according to prior art. Each portion of electrically conductive adhesive 20, electrically connecting one of the conductor patterns 6 of the interconnection conductor track 4 of the first face 2, connects a portion of the metalised surface of the metalised track 420 of the second face 12.

In order to completely fill the internal volume of each conductor pattern 6 with the electrically conductive adhesive 20, so that the portion of the first face 2a is completely covered and effectively participates in adhesion, the volume of each portion of electrically conductive adhesive 20 is preferably greater than or equal to 1.2 times the internal volume of the conductor pattern 6 connected by said portion of adhesive 20. In this way, the electrically conductive adhesive 20 protrudes from the conductor pattern 6 and directly contacts the metallised track 420 during assembly of the photovoltaic chain 50.

FIG. 25 schematically represents an implementation of a method for manufacturing 70 the photovoltaic chain 50 according to the embodiments of FIGS. 22 and 23. A first step 71 of the method for manufacturing 70 the photovoltaic chain 50 is to provide first and second photovoltaic cells 1.

A second step 72 of said method is to deposit a plurality of portions of electrically conductive adhesive 20 on at least some of the conductor patterns 6 of the interconnection conductor track 4 of the first photovoltaic cell 1, as represented in FIGS. 26 and 27. Preferably, a portion of electrically conductive adhesive 20 is deposited on each conductor pattern 6 of the interconnection conductor track 4 of the first photovoltaic cell 1.

In order to reduce the risk of dripping on the first face of the cell 1, each portion of electrically conductive adhesive 20 has to be disposed precisely on each of the conductor patterns 6. For this purpose, screen-printing is preferably used to deposit each portion of adhesive with sufficient precision. Screen-printing can be carried out by means of a screen-printing screen having for example 200 wires of 40 µm or by means of a metal strip of 100 µm.

Finally, the last step 73 is to interconnect the second cell 1 to the first cell 1 by means of the plurality of portions of electrically conductive adhesive 20. The second face 12 of the second cell 1 covers a zone of the first face 2 of the first cell 1, called "coverage zone", in which the interconnection conductor track 4 is located, the second face 12 of the second cell 1 is pressed against the plurality of portions of electrically conductive adhesive 20, allowing the electrical connection and adhesion between the first and second cells 1.

A thermal treatment for cross-connecting the electrically conductive adhesive 20 may be performed in parallel with each of steps 71, 72, 73 or following the last step 73. During the thermal treatment, the portions of electrically conductive adhesive 20 are subjected to a temperature between 120° C. and 150° C. for several minutes.

During the step 72 of depositing the plurality of portions of electrically conductive adhesive 20, the adhesive 20 is advantageously deposited in a smaller pattern in the plane of the first face 2 but higher out of the plane of the first face 2, so as to be compressed and spread, within the boundary of the closed contour 7 in the interconnection step 73. FIGS. 28 and 29 represent four examples of portions of electrically conductive adhesive 21, 22, 23, 24 deposited on the conductor patterns 6 of FIG. 7. The widths of each portion of adhesive 21, 22, 23, 24, measured perpendicular to the edge 3, are preferably less than the internal width C of the closed contours 7 so that the portions of adhesive 21, 22, 23, 24 do not spill over during the interconnection step. For example, for a closed contour 7 whose internal width C is equal to 300 µm, a portion of adhesive 21, 22, 23, 24 having a width of 280 µm is preferentially deposited.

The portions of adhesive 21, 22, 23, 24 may be wider than the internal width C of the closed contours 7 but preferably less than the external width D of the closed contours 7, which may cause the adhesive 20 to spill over but minimises the risk of the adhesive 21, 22, 23, 24 dripping off the face 2, 12 exposed to light radiation. However, the widths of the portions of adhesive 21, 22, 23, 24 can be greater than the external width D of the closed contours 7 without necessarily causing adhesive 21, 22, 23, 24 to drip. For example, for a coverage distance Z of 1.0 mm and an external width D of the closed contours equal to 400 µm, approximately 300 µm of margins on either side of the closed contours 7 are sufficient to contain the superfluous adhesive 21, 22, 23, 24. In this example, portions of adhesive 21, 22, 23, 24 of width equal to 500 µm can be deposited without involving drips of adhesive 21, 22, 23, 24 on the faces exposed to light radiation.

The lengths of the portions of adhesive 21, 23, measured in parallel to the edge 3, are preferably less than the internal length of the closed contours 7, in order to avoid spillover or dripping. However, in order to favor electrical contact on the first and third retention lines 7a, 7c, the lengths of the portions of adhesive 22, 24 may be greater than the external length of the closed contours 7, so that the portions of adhesive 22, 23 cover the first and third retention lines 7a, 7c. The lengths of the portions of adhesive 21, 23 may for example be between 1 mm and 4 mm. For example, for a closed contour 7 with an internal length F equal to 1100 µm and an external length G equal to 1300 µm, a portion of adhesive 21, 22, 23, 24 with a length of 1700 µm is preferentially deposited.

In the embodiment of FIG. 28, the portions of electrically conductive adhesive 21, 22 are screen-printed onto the conductor patterns 6. In the embodiment of FIG. 29, the portions of adhesive 23, 24 are deposited as drops on the conductor patterns 6.

FIG. 30 schematically represents an example of a portion of adhesive 25 deposited on a spacing-ensuring pillar 10 of the embodiment of FIG. 17. The volume of the portion of adhesive 25 deposited on the spacing-ensuring pillar 10 should be small enough to prevent spillover of the adhesive out of the coverage zone. For example, for a pillar 10 having a surface area of 400 μm×300 μm, the portion of adhesive 25 may be screen-printed in the center of the pillar 10 with a surface area equal to 200 μm×100 μm. Thus, the spacing-ensuring pillar 10 contributes to adhesion and electrical conduction within the photovoltaic chain 50.

When the photovoltaic cell 1 comprises a plurality of spacing-ensuring pillars 10, a plurality of portions of electrically conductive adhesive 25 may be deposited on at least some of the spacing-ensuring pillars 10. Preferably, a portion of electrically conductive adhesive 25 is deposited on each spacing-ensuring pillar 10, however, it is possible to not deposit electrically conductive adhesive on any of the spacing pads.

The invention claimed is:

1. A photovoltaic cell comprising a first face and a second face opposite to the first face, the first face comprising:
   an edge;
   an interconnection conductive track extending in parallel to the edge to within 1.3 mm; and
   a plurality of electrodes forming collection fingers, extending in parallel to each other and electrically connected to the interconnection conductive track;
   the interconnection conductive track comprising a plurality of spaced-apart closed-contour conductive patterns, each closed-contour conductive pattern comprising a closed contour surrounding a portion of the first face, and the second face of the photovoltaic cell comprising:
   an edge, opposite to the edge of the first face;
   an interconnection conductive track extending in parallel to the edge to within 1.3 mm of the edge;
   a plurality of electrodes forming collection fingers, extending in parallel to each other and electrically connected to the interconnection track; and
   the interconnection conductive track of the second face comprising a plurality of spaced-apart closed-contour conductive patterns, each closed-contour conductive pattern comprising a closed contour surrounding a portion of the second face.

2. The photovoltaic cell according to claim 1, wherein the closed contour of the first face comprises first, second, third and fourth retention lines,
   the first and third retention lines being disposed facing each other;
   the second and fourth retention lines being disposed facing each other and each connecting the first and third retention lines.

3. The photovoltaic cell according to claim 1, wherein each closed-contour conductive pattern of at least some of the closed-contour conductive patterns of the first face is electrically connected to at least one collection finger.

4. The photovoltaic cell according to claim 3, wherein each closed-contour conductive pattern of at least some of the closed-contour conductive patterns of the first face comprises a conductive pad located inside the closed contour and connected to the closed contour.

5. The photovoltaic cell according to claim 4, wherein the conductor pad is located as an extension of a collection finger.

6. The photovoltaic cell according to claim 1, wherein the interconnection conductive track of the first face further comprises a first conductive line electrically connecting two consecutive closed-contour conductive patterns.

7. The photovoltaic cell according to claim 6, wherein the first conductor line electrically connects all closed-contour conductive patterns two by two.

8. The photovoltaic cell according to claim 6, wherein the first conductive line is connected to at least one collection finger.

9. The photovoltaic cell according to claim 6, wherein the interconnection conductive track of the first face further comprises a second conductive line electrically connecting all closed-contour conductive patterns two by two.

10. The photovoltaic cell according to claim 1, wherein the interconnection conductive track of the first face comprises a spacing-ensuring pillar, the spacing-ensuring pillar having a height greater than or equal to the height of the closed-contour conductive patterns.

11. The photovoltaic cell according to claim 10, wherein the spacing-ensuring pillar is connected to a collection finger and electrically connected to a closed-contour conductive pattern.

12. The photovoltaic cell according to claim 1, wherein the interconnection conductive track of the first face is separated by a first distance from the edge of the first face and the interconnection conductive track of the second face is separated by a second distance from the edge of the second face, the second distance being strictly greater than the first distance.

13. The photovoltaic cell according to claim 1, wherein the first face is a front face and the second face is a back face.

14. A photovoltaic chain comprising first and second photovoltaic cells according to claim 1, the second photovoltaic cell being interconnected to the first photovoltaic cell, the second face of the second photovoltaic cell covering a zone of the first face of the first photovoltaic cell, called the coverage zone, in which the interconnection conductive track of the first face is located.

15. The photovoltaic chain according to claim 14, the interconnection conductive track of the first face of the first photovoltaic cell is electrically connected to the second face of the second photovoltaic cell by a plurality of portions of electrically conductive adhesive, at least some of the portions of electrically conductive adhesive each electrically connecting a closed-contour conductive pattern of the interconnection conductive track of the first face of the first photovoltaic cell with a conductive element of the second face of the second photovoltaic cell, the plurality of portions of electrically conductive adhesive adhering to a plurality of portions of the first face of the first photovoltaic cell.

16. The photovoltaic chain according to claim 15, wherein a volume of each portion of electrically conductive adhesive connecting a closed-contour conductive pattern is greater than or equal to 1.2 times the internal volume of said closed-contour conductive pattern of the first face.

17. The photovoltaic chain according to claim 14, wherein the second face of the second photovoltaic cell comprises an additional interconnection conductive track comprising a plurality of additional closed-contour conductive patterns and wherein the interconnection conductive track of the first face of the first photovoltaic cell is electrically connected to the additional interconnection conductive track of the second face of the second photovoltaic cell by a plurality of portions of electrically conductive adhesive, at least some of the portions of electrically conductive adhesive each electrically connecting one of the conductive patterns of the first face of the first photovoltaic cell with one of the additional closed-contour conductive patterns of the second photovoltaic cell, the plurality of portions of electrically conductive adhesive adhering to a plurality of portions of the first face of the first photovoltaic cell and a plurality of portions of the second face of the second photovoltaic cell.

18. The photovoltaic chain according to claim 17, wherein the volume of each portion of electrically conductive adhesive connecting one of the closed-contour conductive patterns of the first face of the first photovoltaic cell and one of the additional closed-contour conductive patterns is greater than or equal to 1.1 times the sum of the internal volumes of the closed-contour conductive pattern and the additional closed-contour conductive pattern.

19. A method for manufacturing a photovoltaic cell, comprising:
  forming on a face of a substrate an interconnection conductive track extending in parallel to an edge of the substrate to within 1.3 mm of the edge, the interconnection conductive track comprising a plurality of spaced-apart closed-contour conductive patterns, each closed-contour conductive pattern comprising a closed contour surrounding a portion of the first face of the substrate; and
  forming a plurality of electrodes forming collection fingers extending in parallel to each other and electrically connected to the interconnection track of the first face,
  forming on a second face of the substrate an interconnection conductive track extending in parallel to an edge, opposite to the edge of the first face, to within 1.3 mm of the edge of the second face, the interconnection conductive track of the second face comprising a plurality of spaced-apart closed-contour conductive patterns, each closed-contour conductive pattern comprising a closed contour surrounding a portion of the second face; and
  forming a plurality of electrodes forming collection fingers, extending in parallel to each other and electrically connected to the interconnection track of the second face.

20. A method for manufacturing a photovoltaic chain, comprising:
  providing first and second photovoltaic cells according to claim 1;
  depositing a portion of electrically conductive adhesive on at least some of the closed-contour conductive patterns of the interconnection conductive track of the first face of the first photovoltaic cell, the plurality of portions of electrically conductive adhesive thus formed adhering to a plurality of portions of the first face of the first photovoltaic cell; and
  interconnecting the second photovoltaic cell to the first photovoltaic cell, the second face of the second photovoltaic cell covering a zone of the first face of the first photovoltaic cell, called the coverage zone in which the interconnection conductive track is located, the second face of the second photovoltaic cell being electrically and mechanically connected by the plurality of portions of electrically conductive adhesive.

* * * * *